United States Patent
Mohajer et al.

(10) Patent No.: US 10,763,890 B2
(45) Date of Patent: Sep. 1, 2020

(54) COMPUTATIONAL DEVICES USING THERMOMETER CODING AND SCALING NETWORKS ON UNARY ENCODED DATA

(71) Applicant: Regents of the University of Minnesota, Minneapolis, MN (US)

(72) Inventors: Soheil Mohajer, Plymouth, MN (US); Zhiheng Wang, St Paul, MN (US); Kiarash Bazargan, Plymouth, MN (US); Sayed Abdolrasoul Faraji, Minneapolis, MN (US)

(73) Assignee: Regents of University of Minnesota, Minneapolis, MN (US)

( * ) Notice: Subject to any disclaimer, the term of this patent is extended or adjusted under 35 U.S.C. 154(b) by 0 days.

(21) Appl. No.: 16/186,047

(22) Filed: Nov. 9, 2018

(65) Prior Publication Data

US 2019/0149166 A1     May 16, 2019

Related U.S. Application Data

(60) Provisional application No. 62/584,447, filed on Nov. 10, 2017.

(51) Int. Cl.
*H03M 1/66* (2006.01)
*H03M 7/16* (2006.01)
(Continued)

(52) U.S. Cl.
CPC ....... *H03M 7/165* (2013.01); *H03M 13/2903* (2013.01); *H03K 19/21* (2013.01)

(58) Field of Classification Search
CPC .... H03M 1/0673; H03M 1/0665; H03M 1/74; H03M 7/12; H03M 7/14; H03M 1/001;
(Continued)

(56) References Cited

U.S. PATENT DOCUMENTS 5,856,799 A * 1/1999 Hamasaki ........... H03M 1/0663
                                                                 341/118
5,977,899 A * 11/1999 Adams ..................... H03M 3/50
                                                                 341/143
(Continued)

FOREIGN PATENT DOCUMENTS

GB          1184652         3/1970
WO       2017/001212 A1     1/2017

OTHER PUBLICATIONS

Alaghi et al., "Stochastic Circuits for Real-Time Image-processing Applications," 2013 50th ACM/EDAC/IEEE Design Automation Conference (DAC), Jun. 2013, 6 pp.
(Continued)

*Primary Examiner* — Linh V Nguyen
(74) *Attorney, Agent, or Firm* — Shumaker & Sieffert, P.A.

(57) ABSTRACT

This disclosure describes techniques for performing computational operations on input unary bit streams using one or more scaling networks. In some examples, a device is configured to perform a digital computational operation, where the device includes a plurality of input wires and a plurality of output wires. Each input wire is configured to receive a respective input bit of an encoded input value, and each output wire is configured to output a respective output bit of an encoded output value. The device also includes scaling network circuitry configured to apply a function to the encoded input value by electrically routing at least one input wire of the plurality of input wires to at least two output wires of the plurality of output wires. The device can also include hybrid binary/unary computations.

20 Claims, 24 Drawing Sheets

(51) Int. Cl.
*H03M 13/29* (2006.01)
*H03K 19/21* (2006.01)
(58) Field of Classification Search
CPC ........ H03M 1/066; H03M 1/145; H03M 1/68;
H03M 3/338; H03M 3/344; H03M 1/109;
H03M 1/66; H03M 7/02; H03M 7/165;
H03M 7/22
USPC .......................................... 341/118, 143, 144
See application file for complete search history.

(56) References Cited

U.S. PATENT DOCUMENTS

| | | | | |
|---|---|---|---|---|
| 6,124,813 | A * | 9/2000 | Robertson | H03M 1/0665 341/143 |
| 6,348,884 | B1 * | 2/2002 | Steensgaard-Madsen | H03M 1/0665 341/118 |
| 6,380,878 | B1 * | 4/2002 | Pinna | H03M 1/0665 341/120 |
| 6,466,153 | B1 * | 10/2002 | Yu | H03M 1/0673 341/120 |
| 6,570,521 | B1 * | 5/2003 | Schofield | H03M 1/0673 341/143 |
| 7,205,913 | B2 * | 4/2007 | Adams | H03M 1/0665 341/60 |
| 7,868,806 | B2 * | 1/2011 | Seo | H03M 1/004 341/118 |
| 9,124,287 | B1 * | 9/2015 | Ho | H03M 1/0673 |
| 9,748,837 | B1 * | 8/2017 | Kose | H02M 3/07 |
| 10,063,255 | B2 | 8/2018 | Riedel et al. | |
| 2010/0149012 | A1 * | 6/2010 | Nguyen | H03M 1/0663 341/143 |
| 2017/0255225 | A1 | 9/2017 | Lilja et al. | |
| 2018/0196642 | A1 | 7/2018 | Droulez et al. | |
| 2019/0121839 | A1 | 4/2019 | Mohajer et al. | |

OTHER PUBLICATIONS

Alaghi et al., "Survey of Stochastic Computing," ACM Transactions on Embedded Computing Systems, vol. 12, May 2013, 19 pp.
Brown et al., "Stochastic Neural Computation 1: Computational Elements," IEEE Transactions on Computers, vol. 50, No. 9, Sep. 2001, 15 pp.
Demaeyer et al., "Noise-induced Escape from Bifurcating Attractors: Symplectic Approach in the Weak-noise Limit," Physical Review E, vol. 80, No. 3, Aug. 2009, 16 pp.
Faraji et al., "Energy-Efficient Convolutional Neural Networks with Deterministic Bit-Stream Processing," 2019 Design, Automation, and Test in Europe Conference & Exhibition (DATE), Mar. 2019, 6 pp.
Faraji et al., "Hybrid Binary-Unary Hardware Accelerator," ASPDAC '19 Proceedings of the 24th Asia and South Pacific Design Automation Conference, Jan. 2019, 6 pp.
Gaines, "Stochastic Computing Systems," Advances in Information Systems Science, vol. 2, Chapter 2, 1969, 69 pp. (Applicant points out, in accordance with MPEP 609.04(a), that the year of publication, 1956, is sufficiently earlier than the effective U.S. filing date, so that the particular month of publication is not in issue.).
Hamm et al., "Quasipotentials for Simple Noisy Maps with Complicated Dynamics," Journal of Statistical Physics, vol. 66, No. 3, Feb. 1992, pp. 689-725, 37 pp.
Jaworski, "Verilog HDL Model based Thermometer-to-binary Encoder with Bubble Error Correction," 2016 MIXDES—23rd International Conference Mixed Design of Integrated Circuits and Systems, Jun. 2016, 6 pp.
Jenson et al., "A Deterministic Approach to Stochastic Computation," 2016 IEEE/ACM International Conference on Computer—Aided Design (ICCAD), Nov. 2016, 8 pp.

Kim et al., "An Energy-efficient Random Number Generator for Stochastic Circuits," 2016 21st Asia and South Pacific Design Automation Conference (ASP-DAC), Jan. 2016, 6 pp.
Li et al., "A Stochastic Reconfigurable Architecture for Fault-Tolerant Computation with Sequential Logic," 2012 IEEE 30th International Conference on Computer Design (ICCD), Sep. 2012, 6 pp.
Li et al., "Logical Computation on Stochastic Bit Streams with Linear Finite State Machines," IEEE Transactions on Computers, vol. 63, No. 6, Jun. 2014, 14 pp.
Li_et al., "A Reconfigurable Stochastic Architecture for Highly Reliable Computing," GLSVLSI '09 Proceedings of the 19th ACM Great Lakes Symposium on VLSI, May 2009, 6 pp.
McNeill et al., "Dynamic Range and Error Tolerance of Stochastic Neural Rate Codes," Neurocomputing, vol. 48, Oct. 2002; 13 pp.
Mohajer et al., "Routing Magic: Performing Computations Using Routing Networks and Voting Logic on Unary Encoded Data," Proceedings of ACM/SIGDA International Symposium on Field-Programmable Gate Arrays (FPGS'18) Feb. 2018, 10 pp.
Najafi et al., "A Reconfigurable Architecture with Sequential Logic-based Stochastic Computing," ACM Journal on Emerging Technologies in Computing Systems (JETC) vol. 13, No. 4, Aug. 2017, 28 pp.
Najafi et al., "High Quality Down-Sampling for Deterministic Approaches to Stochastic Computing," IEEE Transactions on Emerging Topics in Computing, Jan. 2018, 7 pp.
Qian et al., "An Architecture for Fault-Tolerant Computation with Stochastic Logic," IEEE Transactions on Computers, vol. 60, No. 1, Jan. 2011, 13 pp.
Qian et al., "The Synthesis of Robust Polynomial Arithmetic with Stochastic Logic," 2008 45th ACM/IEEE Design Automation Conference, Jun. 2008, 6 pp.
Qian et al., "The Synthesis of Stochastic Circuits for Nanoscale Computation," International Journal of Nanotechnology and Molecular Computation, vol. 1, No. 4, Oct. 2009, 19 pp.
Qian et al., "Uniform Approximation and Bernstein Polynomials with Coefficients in the Unit Interval," European Journal of Combinatorics, vol. 32, No. 3, Apr. 2011, 16 pp.
Salehi et al., "Computing Polynomials with Positive Coefficients using Stochastic Logic by Double-NAND Expansion," Proceedings of the on Great Lakes Symposium on VLSI, May 2017, 4 pp.
Sehwag et al., "A Parallel Stochastic Number Generator with Bit Permutation Networks," IEEE Transactions on Circuits and Systems II: Express Briefs, vol. 65, No. 2, Feb. 2018, 5 pp.
Zhu et al., "Binary Stochastic Implementation of Digital Logic," FPGA '14 Proceedings of the 2014 ACM/SIGDA International Symposium on Field-Programmable Gate Arrays, Feb. 2014, 9 pp.
Von Neumann, "Probabilistic Logics and the Synthesis of Reliable Organism from Unreliable Components," Automata Studies, 1956, 56 pp. (Applicant points out, in accordance with MPEP 609.04(a), that the year of publication, 1956, is sufficiently earlier than the effective U.S. filing date, so that the particular month of publication is not in issue.).
Wang et al., "Randomness Meets Feedback: Stochastic Implementation of Logistic Map Dynamical System," 2015 52nd ACM/EDA/IEEE Design Automation Conference (DAC), Jun. 2015, 7 pp.
Wang et al., "Stochastic Implementation and Analysis of Dynamical Systems Similar to the Logistic Map," IEEE Transactions on Very Large Scale Integration (VLSI) Systems, vol. 25, No. 2, Feb. 2017, 15 pp.
Yoo et al., "Design of a 1.8V 10bit 300MSPS CMOS Digital-to-analog converter with a Novel Deglitching Circuit and Inverse thermometer decoder," Asia-Pacific Conference on Circuits and Systems, Oct. 2002, 4 pp.
Yuan et al., "A Throughput-agnostic 11.9-13.6GOPS/mW Multi-Signal Classification SoC for Cognitive Radios in 40nm CMOS," 2015 Symposium on VLSI Circuits, Jun. 2015, 2 pp.

* cited by examiner

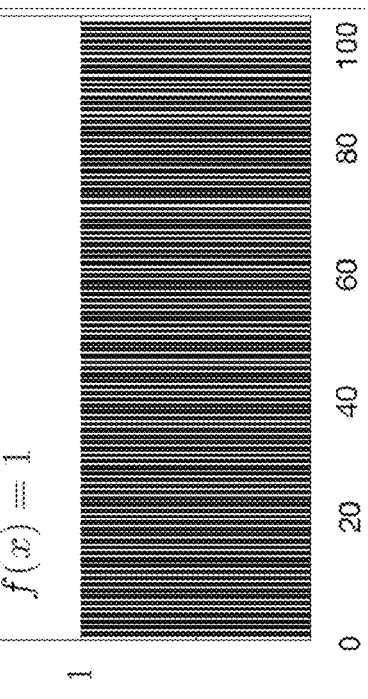
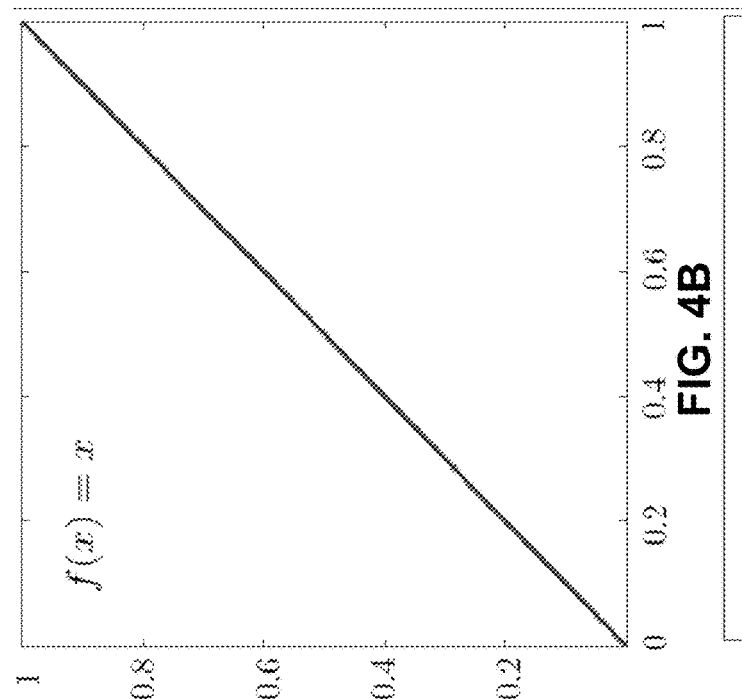
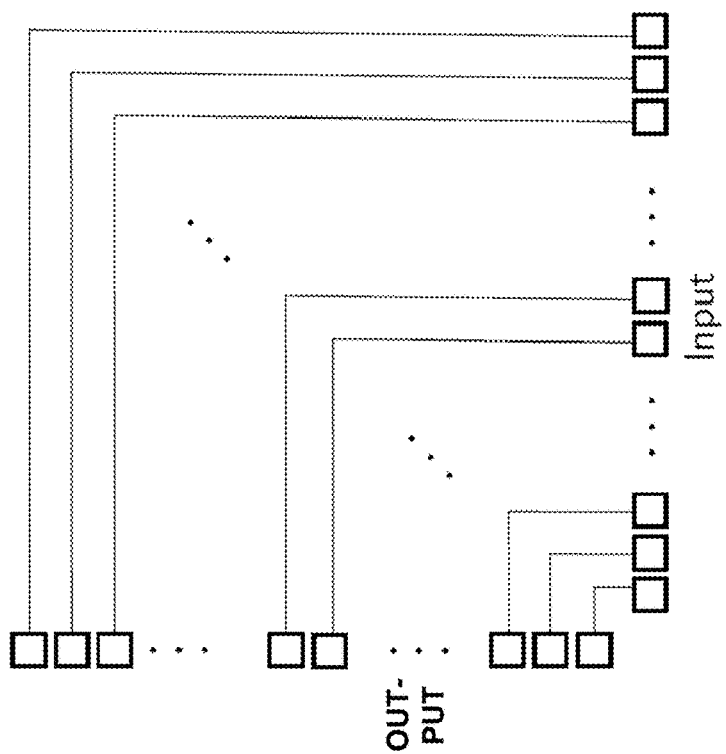

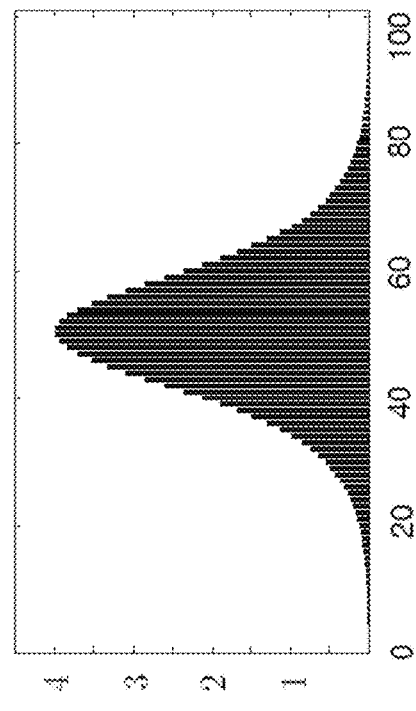
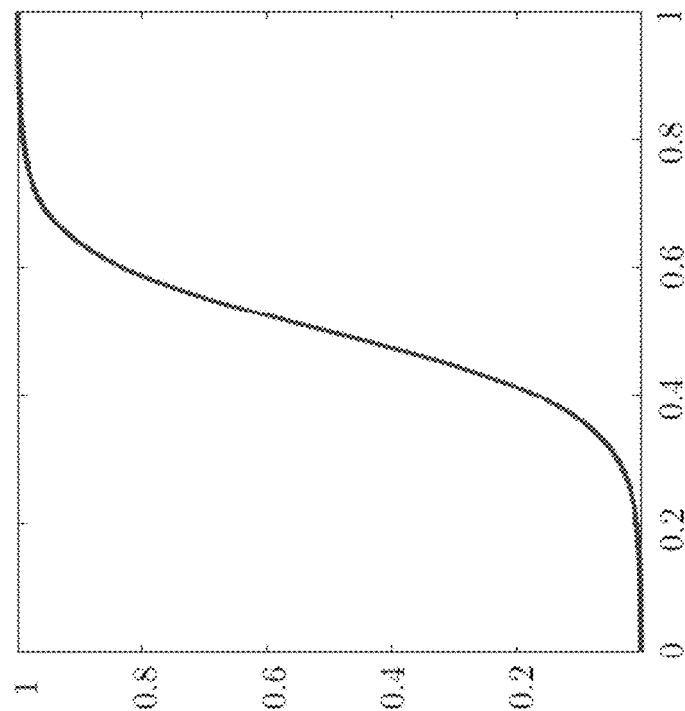
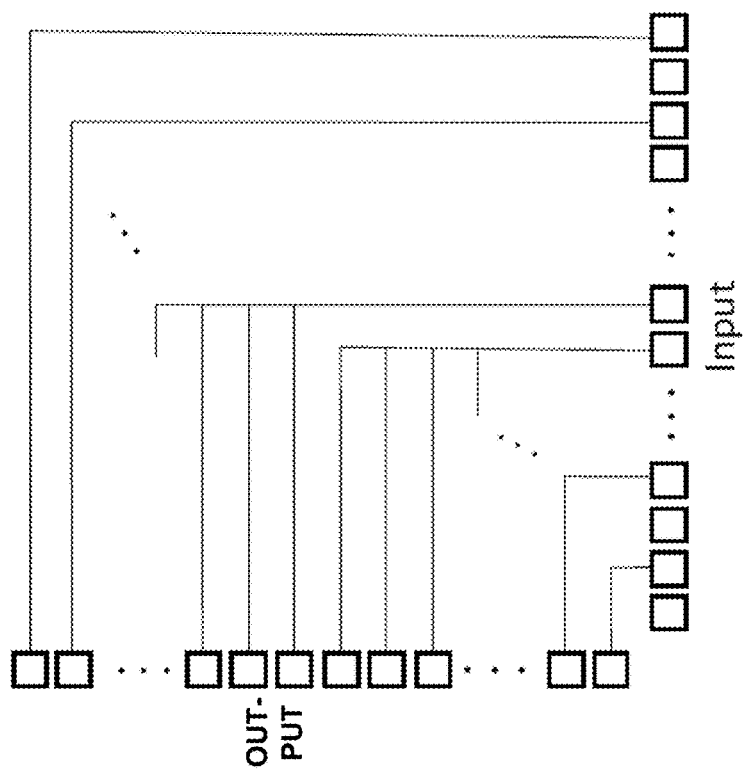
FIG. 6A

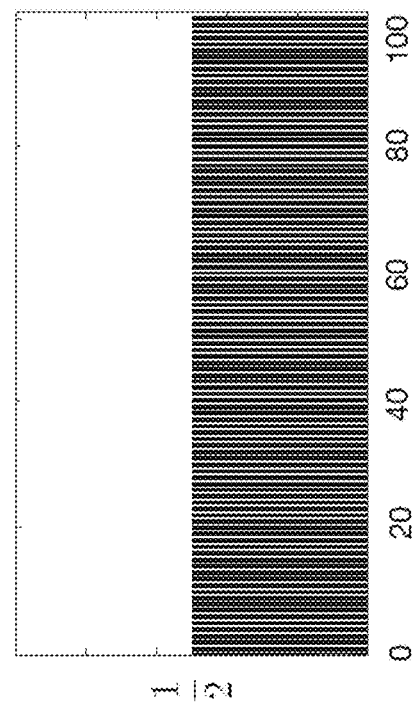
FIG. 7B
FIG. 7C
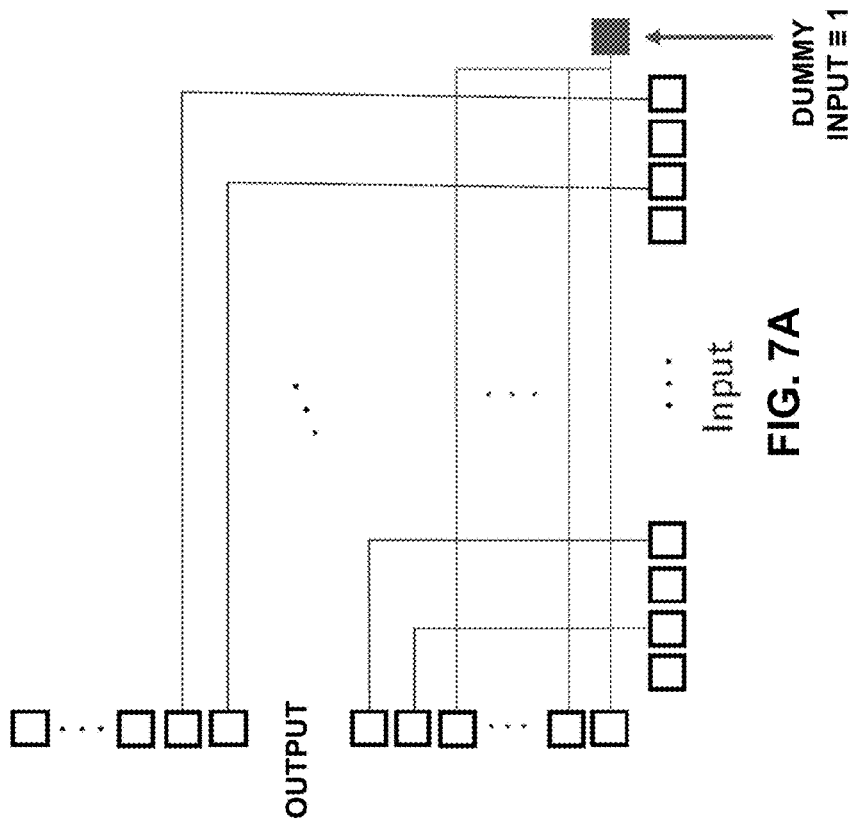
FIG. 7A

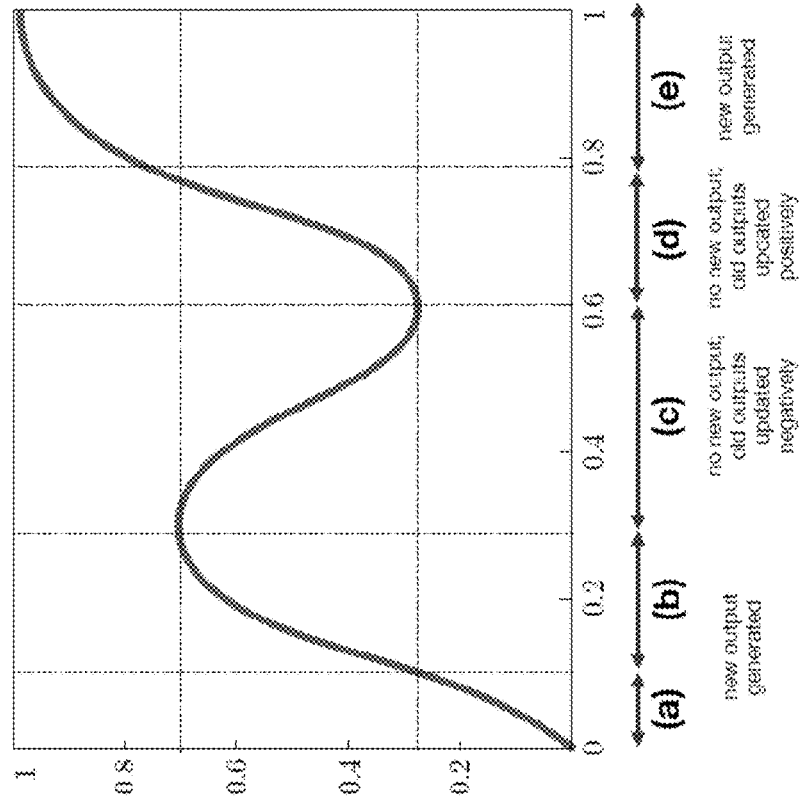
FIG. 9A
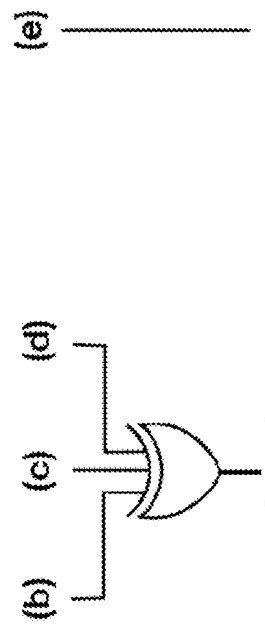
FIG. 9B
FIG. 9C

| | $X_1$ | $X_2$ | $X_3$ | $X_4$ |
|---|---|---|---|---|
| $Y_4$ | 1 | 0 | 1 | 1 |
| $Y_3$ | 1 | 0 | 0 | 0 |
| $Y_2$ | 0 | 0 | 0 | 0 |
| $Y_1$ | 0 | 1 | 1 | 1 | function values

FIG. 10C alternating

FIG. 10B triggering

FIG. 10A

TABLE VI

COMPUTATIONAL DEVICES USING THERMOMETER CODING AND SCALING NETWORKS ON UNARY ENCODED DATA

This application claims the benefit of U.S. Provisional Patent Application No. 62/584,447 (filed Nov. 10, 2017), the entire content being incorporated herein by reference.

GOVERNMENT INTEREST

This invention was made with government support under CCF-1408123 awarded by National Science Foundation. The government has certain rights in the invention.

TECHNICAL FIELD

The invention relates to electronic circuits and, in particular, performing arithmetic operations and complex mathematical functions in electronic circuits.

BACKGROUND

Electronic circuits capable of performing digital computations have become ubiquitous in consumer and industrial products and are used in countless applications. Digital logic circuitry has heavily relied on binary representation of data for decades due to its compact storage requirements. The advantage of the positional binary representation stems from the logarithmic space requirements of binary numbers, i.e., represent N discrete values requires only log(N) bits.

However, binary representation comes with a cost. Since the binary number system is positional, processing binary numbers may include "unpacking" bits, performing computations, and repacking the bits back to binary. For example, computations such as multiplication and addition need to "unpack" the number by either generating partial products in the case of multiplication, or working with a carry chain in the case of addition. As a result, circuits designed to perform operations on binary representations of values often require larger, more complex computational logic.

One alternative to binary representation is a unary number system, which is a simpler, less compact technique for representing values. In a unary representation, N bits are used, out of which the M bits are set to 1 to represent a value M or a value of M/N. Performing computations on unary bit streams may require less complex digital logic than binary circuits, but typically requires serial operations on unary bit streams. Moreover, conventional techniques for processing unary bit streams, including stochastic computing and parallel unary computing, often have inherent limitations on the types of functions that can be implemented and these limitations may lead to significant approximation errors.

SUMMARY

In general, techniques are described in which circuitry is configured to perform digital computations on unary encoded data using scaling networks to implement computational operations, such as monotonically increasing functions or non-monotonic functions. For example, as described, circuitry may be configured with scaling networks configured to receive thermometer encoded unary data on a set of input wires and to implement an operation or complex function by stretching or contracting the individual bits within the unary encoded data and routing the bits to output wires of the circuitry. Each scaling network within the circuitry, e.g., chip, may be designed to implement a given function on the thermometer-encoded unary data using discrete digital gates and routing circuits.

In some examples, the techniques of this disclosure may include first converting binary inputs or part of the binary inputs to unary bit streams using thermometer encoders and then processing the unary bit streams using one or more of the scaling networks to perform a computational operation and generate the output bits. In some examples, non-monotonic functions may be implemented by dividing the function into piece-wise monotonically increasing or decreasing regions. Voting gates, also referred to herein as alternator logic, combine the outputs of the regions to produce the output bits.

Moreover, as described, the techniques may be applied for configuring scaling networks to implement multivariate functions, i.e., functions operable on multiple unary encoded input bit streams.

The techniques may provide certain technical advantages. For example, as discussed herein, certain computations and functions, such as monotonically increasing functions, can be implemented using the scaling techniques without requiring use of any computational logic. In addition the techniques achieve technically efficient utilization of buffered routing resources of FPGAs, as one example. Moreover, an area×delay cost for circuitry implemented as described herein may be significantly lower than conventional binary circuits. Other examples and advantages are described herein.

Example applications include sensor-based circuitry, image processing circuitry, specialized circuitry for neural networks and machine learning applications. Additional examples are described herein.

BRIEF DESCRIPTION OF DRAWINGS

FIGS. 4A-4C illustrate a scaling network and derivative for an identity function.

FIGS. 6A-6C illustrate a scaling network and derivative for a general monotonically increasing function.

FIGS. 7A-7C illustrate a scaling network and derivative for a function with an offset.

FIGS. 9A-9C illustrate a scaling network and derivative for an oscillating function.

FIGS. 10A-10C illustrate a scaling network and derivative for function with more than one input unary bit stream.

FIG. 11A shows the results from an example of this disclosure, and FIG. 11B shows results from previous stochastic methods.

FIG. 22 is a table illustrating area and delay results using field-programmable gate arrays.

DETAILED DESCRIPTION

Figure 1:
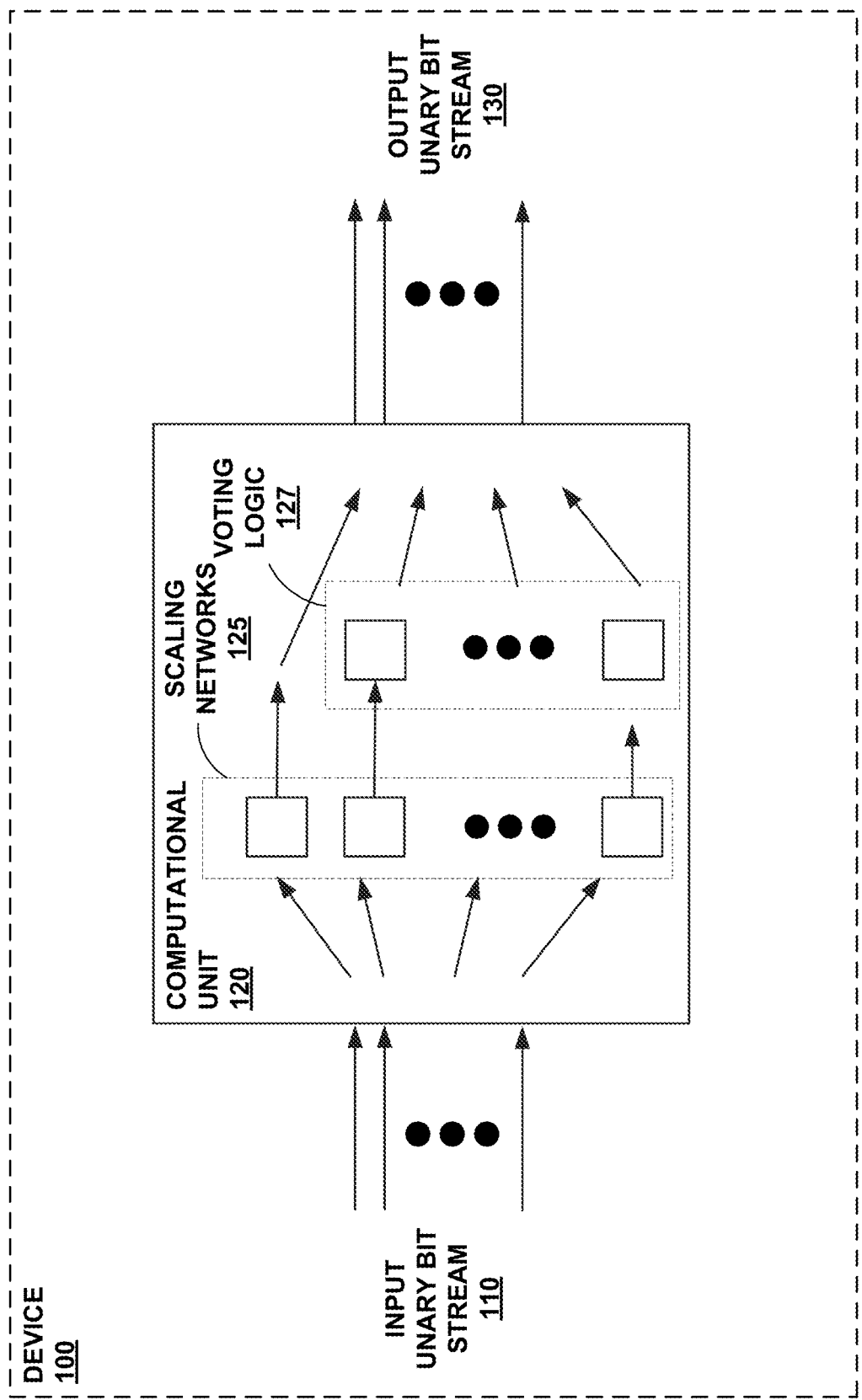
FIG. 1 illustrates a conceptual block diagram of a device configured to perform a computational operation on an input unary bit stream, in accordance with some examples of this disclosure.

This disclosure describes techniques for performing computational operations on input unary bit streams using one or more scaling networks. As described herein, the scaling network may be configured to perform a computational operation representative of application of a function defining a relationship between input values of one or more unary encoded input bit streams and outputs values of an output bit stream. For example, as described, circuitry may be configured with scaling networks configured to receive thermometer encoded unary data on a set of input wires and to implement an operation or complex function by stretching or contracting the individual bits within the unary encoded data and routing the bits to output wires of the circuitry. Each scaling network may be designed to implement a given function on the thermometer unary data using discrete digital gates and routing circuits. As used herein, a wire may be any form of connectivity to convey a logical bit value and may be electronic electrical traces, paths, connections, junctions, links and the like for receiving or outputting bit values.

In this disclosure, novel circuitry is described configured to apply complex functions by, in example implementations, first converting their binary representation to the "flushed unary" data representation. Without loss of generality, only real numbers $x \in [0,1]$, represented with a resolution of $1/N$ are focused on herein. All finite range set of discrete numbers can be scaled to the [0,1] range with the desired resolution. The real number $i/N$, where $N=2^W$ and $i \in \{0, 1, \ldots, N\}$ can be represented using W bits in binary to show the value of i in base 2. The same number can be represented in the "unary" format by using a total of N bits, in which i bits are 1's and N−i bits are zeros, and the order of the appearance of 1's and 0's does not matter. Unlike the binary representation in which each bit has half the weight of the bit immediately to its left, all bits in the unary format have the same weight. Thus, operating on unary numbers may be computationally simpler than operating on binary numbers. As an example, 0.1012 represents the number ⅝, whereas the same number can be represented as either 111110001, 000111111, 110101101, or any other sequence of 1's and 0's that has five 1's and three 0's.

The techniques are described with respect to a canonical unary representation for consistency and for being able to implement circuits that have multiple levels of logic, e.g., feeding the input pixel values in the canonical unary format to a Gamma correction unit, and taking the canonical unary output of the Gamma correction unit and feeding it to an edge detection unit is desired. The "left-flushed unary" representation in which all the 1's appear first in the string of bits has been chosen. A stochastic bit stream encodes the data in a random or pseudo-random manner. That is, a stochastic bit stream with the same length and encoded value as a unary bit stream can have the same number of ones and zeros as the unary bit stream, but the ones and zeroes in the stochastic bit stream will have random positions. The disclosed techniques may use N wires (flip-flops) to represent a unary number in the [0,1] range with a resolution of 1/N.

In some examples, example techniques described herein may implement an efficient binary-to-thermometer encoder configured to convert the input data from binary to the left-flushed unary representation. Once the unary representation is generated on the input wires, monotonically increasing functions can be implemented by a simple scaling network having rewiring that stretches or contracts the bits and routes them to the output wires, hence using only flip-flops and routing. This type of network in which output values are formed by stretching or contracting input bits of one or more unary encoded data values is referred to herein as a scaling network. When configured to operate on thermometer encoded unary inputs, the architecture of the scaling network may generally be designed using the discrete derivative of the desired function to be applied. Upon computation of the output, in some example implementations, output wires can be fed to an adder tree to convert the unary encoded output value to the binary format.

As further described herein, for non-monotonic functions, circuitry having scaling networks for implementing the function can be designed by dividing the function into piece-wise monotonically increasing or decreasing regions. For each region, a corresponding scaling network is designed as described herein, and the outputs of each of these regions are combined using voting (also referred to herein as "alternator") logic that, in some examples, can take the form of simple digital logic. The alternator logic circuitry is optional because, in some examples such as monotonically increasing functions, all of the output wires carrying the thermometer unary coded output value may be directly wired to the input wires carrying the thermometer unary encoded input value using the scaling techniques described herein. Thus, for monotonically increasing functions, once data is converted to the flushed-unary format, for example, computations can be done with no logic at all. In other examples, a first subset (and optionally more subsets) of the output wires carrying the output value may be directly wired to input wires, while a second subset (and optionally more subsets) of the output wires may be wired to the outputs of logic gates in the alternator logic circuitry to easily implement, for example, oscillating piece-wise linear functions or more complex oscillating functions.

In some examples, the alternator logic may take advantage of the ability of field-programmable gate arrays (FPGAs) to implement large fanout logic (about 250 in some cases), although the techniques are not limited to FPGA implementations. For univariate functions and for monotonically increasing multivariate functions, the output of the disclosed scaling network plus alternator logic is also in the canonical format of left-flushed unary representation, so logic is synthesized with a cascade of modules and amortized on the cost of the binary-to-thermometer encoder and thermometer-to-binary decoder. The output is not guaranteed to be in the canonical format for non-monotonic multivariate functions, but in practice, deviations from the canonical format result in about one percent error. For monotonically increasing functions, the scaling network without alternator logic may be sufficient, and the scaling network may use only the routing resources and flip-flops (FFs) on an FPGA architecture.

The techniques disclosed herein may be especially well-suited to FPGAs due to the abundant availability of routing and flip-flop resources, and for the ability of FPGAs to realize high-fanout gates for highly oscillating functions. Given the increasingly larger available pool of flip-flops and deeply buffered routing resources on modern FPGAs, as one example, simpler data formats can be considered that are not as compact as binary in storage, but allow drastically simpler logic to perform the same calculations, hence reducing the area×delay product. This is true especially when the resolution of the data is not high, e.g., when the data is 8-12 bits wide. In this way, the disclosed techniques may, as one example, efficiently utilize the abundant buffered routing resources in FPGAs. Additionally, FPGA architectures are particularly suitable for the disclosed techniques because FPGAs can easily handle large fanouts (10's-100's), which may be used for implementing oscillating functions.

Conventional stochastic computing using randomly encoded (non-deterministic) bit streams can have high latency cost due to the exponential length of stochastic bit streams with respect to the number of equivalent binary bits. Stochastic computation using randomly encoded bit streams can also suffer from errors due to random fluctuations and correlations between bit streams. These effects of latency, random fluctuations, and correlations may worsen as the circuit depth and the number of inputs increase. While the logic to perform the computation is simple, generating random or pseudorandom bit streams can be costly. A randomizer in a stochastic bit stream generator used in conventional devices may account for as much as 90% of the area of the stochastic circuit design.

Given the electronics industry's move towards an ecosystem of specialized accelerators, one possible application is an accelerator in a chip for machine learning. Low bandwidth environments such as mobile platform, as well as low-power environments (e.g., edge computing), are also possibilities. Architectures such as SqueezeNet, YOLO [you only look once], SegNet, and RCNN [regional convolutional neural networks].

The computing architectures described herein may include parallel implementations that use smaller area, and deliver exponentially smaller latency. Stochastic computing methods using stochastic encoded bit streams often use $2^W$ clock cycles to process bits for W bits of binary resolution. The techniques described herein can use unary "thermometer" or "flushed unary" encoding, which is a subset of stochastic encoding. In this representation, all of the 1's appear first, followed by all of the 0's. This disclosure discusses real numbers $x \in [0, 1]$, represented with a resolution of 1/N, but the computational techniques described herein can be used with other numbering formats, such as the range of $x \in [-1, 1]$, and any other upper and lower limits. An alternative encoding that works with the methods described herein, is the "one-hot" encoding (e.g., edge coding), which is a modification of the thermometer encoding. In this modification, only one 1 that sits at the boundary between the 1's and 0's is kept, and all 1's before that edge 1 are converted to zero.

To convert the circuitry used for processing thermometer-encoded bit streams to circuitry for processing edge-encoded bit streams may include some hardware modifications, such adding, removing, or replacing logic gates. For any circuit described herein as handling thermometer-encoded data or unary-encoded data, the circuit may be configured to handle edge-encoded data. For any bit stream described herein as a thermometer-encoded bit stream or a unary bit stream, the bit stream can also use edge coding.

As described herein, the techniques described herein may be especially suitable for applications that can tolerate approximations and medium-resolution computations (8-to 16-bit), such as image processing and machine learning.

In some examples, the technique thermometer encoding and scaling network techniques described herein may be used with computational circuitry similar to stochastic circuitry typically configured to perform computation and operations on stochastic bit streams. Computation and operations can include multiplication, addition, and scaled addition using logic gates (AND, OR, NAND, NOR, XOR, XNOR, and inverter gates), stochastic logic circuitry, lookup tables, and/or any other computational circuitry. However, as explained herein, in various examples, the circuitry may operate on unary encoded and/or hybrid unary-binary encoded input bit streams or other deterministic bit streams and, in some examples, may utilize scaling networks as described herein.

Further example details of logic devices for performing arithmetic operations on deterministic bit streams can be found in commonly assigned U.S. patent application Ser. No. 15/448,997, filed Mar. 3, 2017, and entitled "Polysynchronous Stochastic Circuits," and in commonly assigned U.S. Pat. No. 10,063,255, issued Aug. 28, 2018, and entitled "Stochastic Computation Using Deterministic Bit Streams," each of which is incorporated herein by reference in its entirety.

FIG. 1 illustrates a conceptual block diagram of an electronic device (e.g., a chip) configured to perform computational operations on an input unary bit stream, in accordance with some examples of this disclosure. Device 100 may include an integrated circuit, computational units, processing modules, and/or digital circuitry. In some examples, device 100 may be configured to process sensed data, image data, video data, audio data, and/or any signal data. Device 100 may include digital computing circuitry such as computational unit 120, scaling networks 125, and voting logic 127.

In this example of FIG. 1, device 100 includes computational unit 120 configured to perform a computational operation on input unary bit stream 110 to generate output unary bit stream 130. Input unary bit stream 110 may be a thermometer coded representation of an input binary number or an analog voltage signal received by device 100, where the input number may have a resolution of W bits of binary. As a thermometer coded number, input unary bit stream 110 may have a length of 2' bits. The bits of input unary bit stream 110 may represent a numerical value by the proportion of bits that have a logic value of one.

In general, bit streams 110 and 130 use a set of zeroes and ones to express a fractional number between zero and one. For examples, a bit stream carrying a ten-bit sequence of 1,1,1,0,0,0,0,0,0,0 may represent the value three-tenths because thirty percent of the bits are one. The percentage of ones and zeroes may be one form of unary encoding to represent the numerical value thirty percent or three tenths because the probability that any data bit of the bit stream is high may be equal to the numerical value. Thus, for any set of N bits, the probability that any bit in the set of bits is one corresponds to the value represented by that set of bits in the unary bit stream.

In this manner, bit streams 110 and 130 are similar to bit streams used in stochastic processing circuits in that numerical data values are represented by a probability that any bit in the respective set of data bits is high. However, as described herein, unlike conventional stochastic processing circuits that operate on bit streams in which individual bit values are random or pseudo-randomly generated, bit streams 110 and 130 are generated using a unary encoding scheme, and unlike previous stochastic work, instead of transmitting the bit stream serially in time, bit streams 110 and 130 transmit data in one clock cycle as a bundle of bits, representing the value in space.

In some examples, bit streams 110 and/or 130 include edge-encoded bit streams instead of thermometer encoded unary bit streams. Computational unit 120 can use edge coding and thermometer coding together. For example, computational unit 120 can receive an edge-encoded bit stream and output a thermometer encoded unary bit stream. Computational unit 120 can also receive a thermometer-encoded unary bit stream and output an edge-encoded bit stream.

Figure 17:
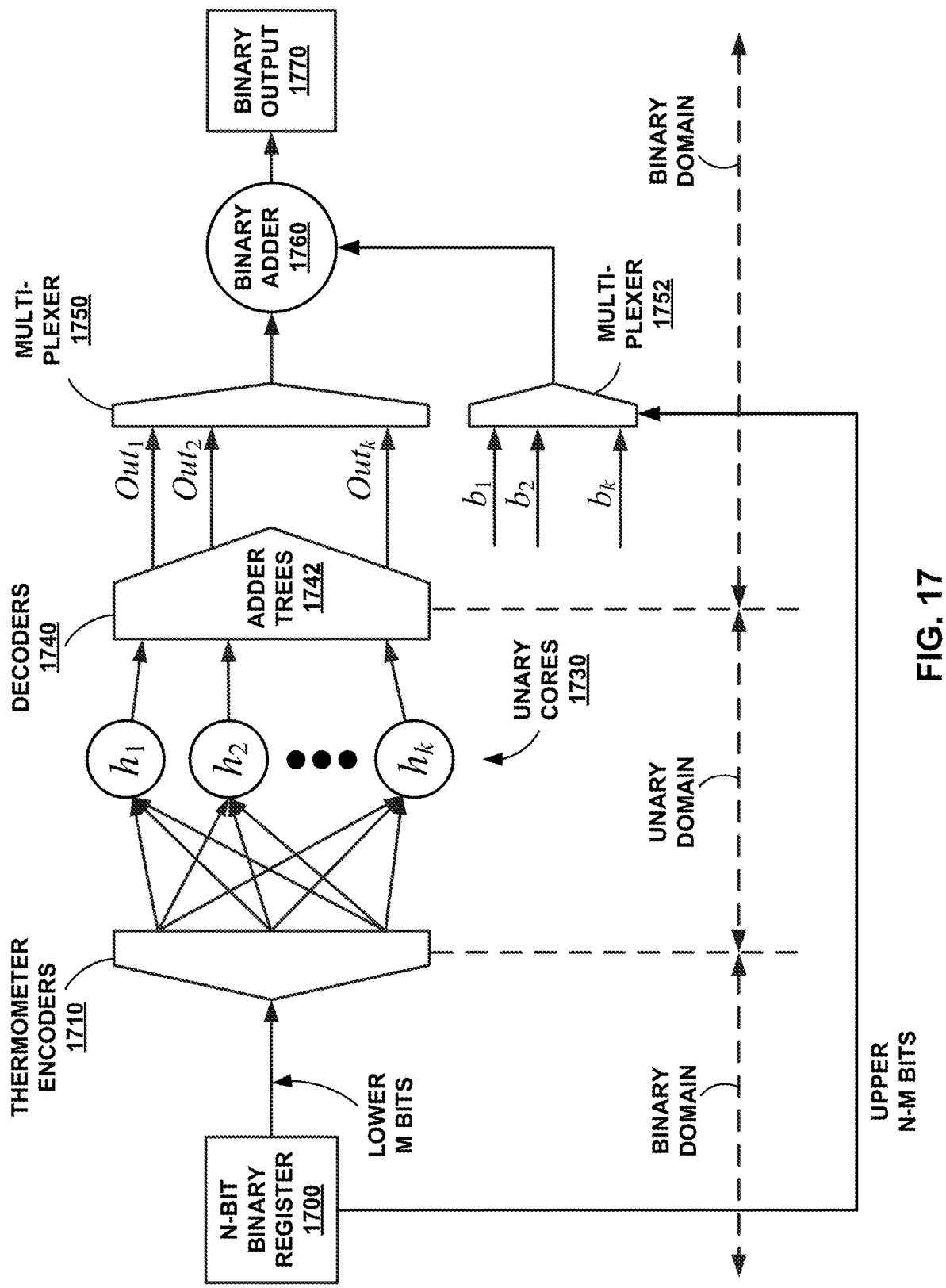
FIG. 17 illustrates a possible architecture for a hybrid binary-unary method.

Computational unit 120 may be configured to perform a computational operation on input unary bit stream 110 by selectively applying one of a set of scaling networks 125, and optionally alternator logic circuitry 127 depending on the particular function to be applied. Computational units 1520 shown in FIG. 15 and unary cores 1730 shown in FIG. 17 are examples of computational unit 120. A given scaling network 125 may have a fanout for input unary bit stream 110 that is generally proportional to the derivative of the transfer function of the computational operation. For example, if the transfer function to be applied by one of scaling networks 125 is $f(x)=x$ (i.e., an identity function), each bit of input unary bit stream 110 may be directly wired to a bit of output unary bit stream 130. If the transfer function is $f(x)=2x$, each bit in the first half of input unary bit stream 110 may be directly wired to two bits of output unary bit stream 130.

Scaling network 125 can implement a function by routing all of the input wires or a subset of the input wires to all of the output wires. Scaling network 125 can route, for each output wire, at least one input wire. Voting logic 127 can be used where more than one input wire is routed to a single output wire. Scaling network 125 may be configured to operate in a manner similar to a smart, efficient lookup table by providing an output value based on the input value received by scaling network 125.

As further described below, the alternator logic circuitry (voting logic 127) of computational unit 120 may enable implementation of transfer functions where at least a portion of the function has a negative slope, such as monotonically decreasing functions or oscillating functions. Voting logic 127 can include any kind of logic gates and/or lookup tables. The logic gates can be AND, NAND, OR, NOR, XOR, XNOR, NOT, and/or other types of logic gates. As one example, for regions having negative slopes, the alternator logic circuitry may include XOR gates that output a logic value of zero when two input bits selected from the input stream have a logic value of one, i.e., for cancelling out the contributions of where, based on the thermometer unary encoded input value, both a bit associated with an increasing region of the function and a symmetric bit associated with the decreasing region are one, as further demonstrated herein. As another example, computational unit 120 may be configured to receive two or more input unary bit streams and generate output unary bit stream 130 based on the two or more input unary bit streams, in which case the alternator logic circuitry (voting logic 127) for the scaling network 125 may include one or more OR gates to effectively add the contributions from the bits from the multiple input unary bit streams. For example, for processing with edge-encoded bit streams, OR gates may be used instead of, or in addition to, XOR gates.

In some examples, based on the function to be applied, an output wire for a scaling network 125 associated with one or more bits of output unary bit stream 130 may be hardwired to a logic value of one or a logic value of zero. If, for a given scaling network 125, an output wire associated with an output bit of output unary bit stream 130 is hardwired to a logic value of one, the scaling unit may effectively be used to implement functions and generate output unary bit stream 130 having a positive numerical offset. For example, a scaling network may be implemented where an offset may be represented in a transfer function such as $f(x)=(1+x)/2$, where half of the bits of output unary bit stream 130 may be hard-wired to a logic value of one. If, for a scaling network 125, an output wire corresponding to a bit of output unary bit stream 130 is hardwired to a logic value of zero, the scaling network may effectively generate output unary bit stream 130 with a negative offset. The offset may be represented in a transfer function such as $f(x)=x/2$, where half of the bits of output unary bit stream 130 may be hard-wired to a logic value of zero such that, for example, $f(1)=\frac{1}{2}$.

Figure 15:
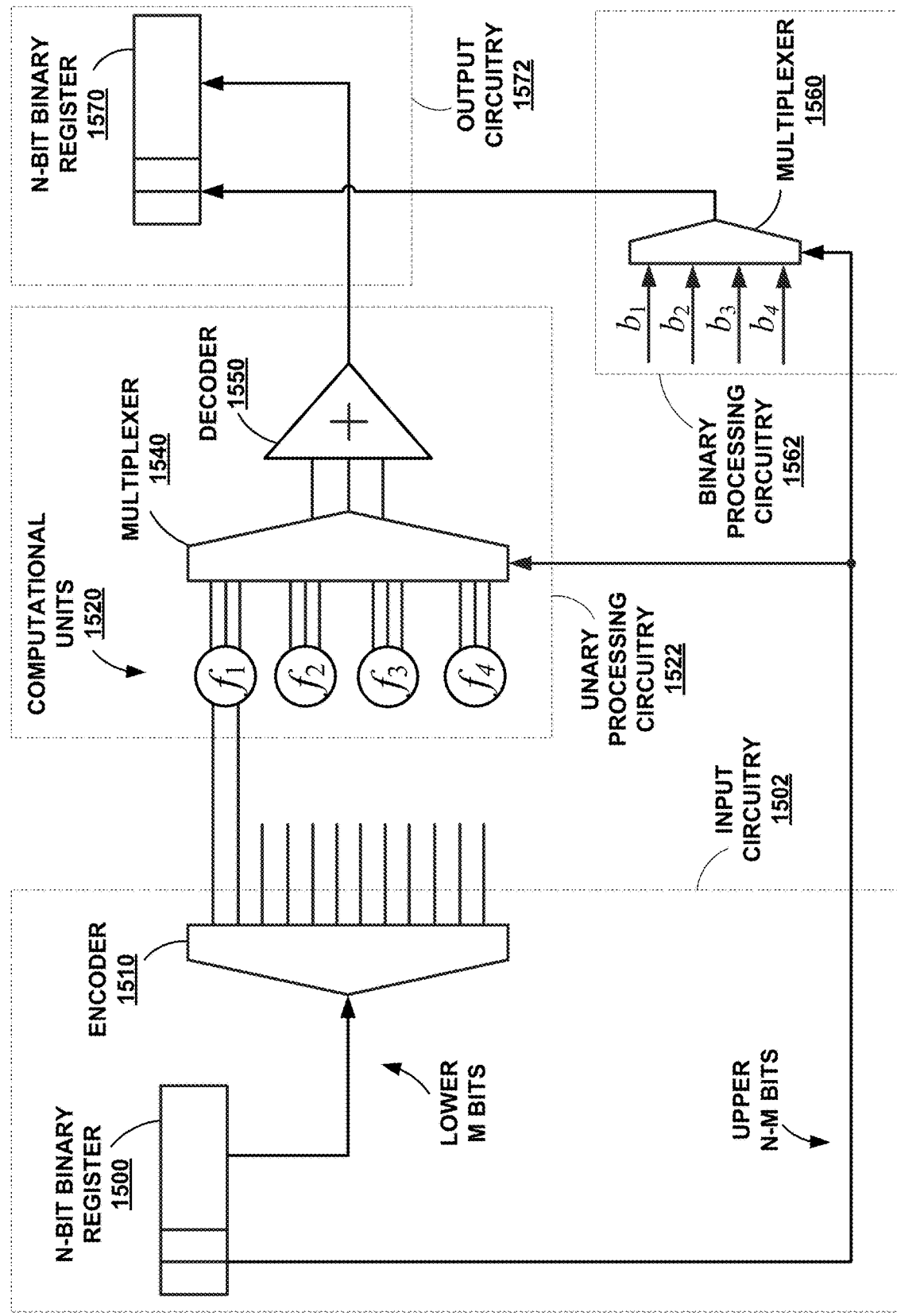
FIG. 15 is a conceptual block diagram of a hybrid binary-unary architecture, in accordance with some examples of this disclosure.
Figure 20:
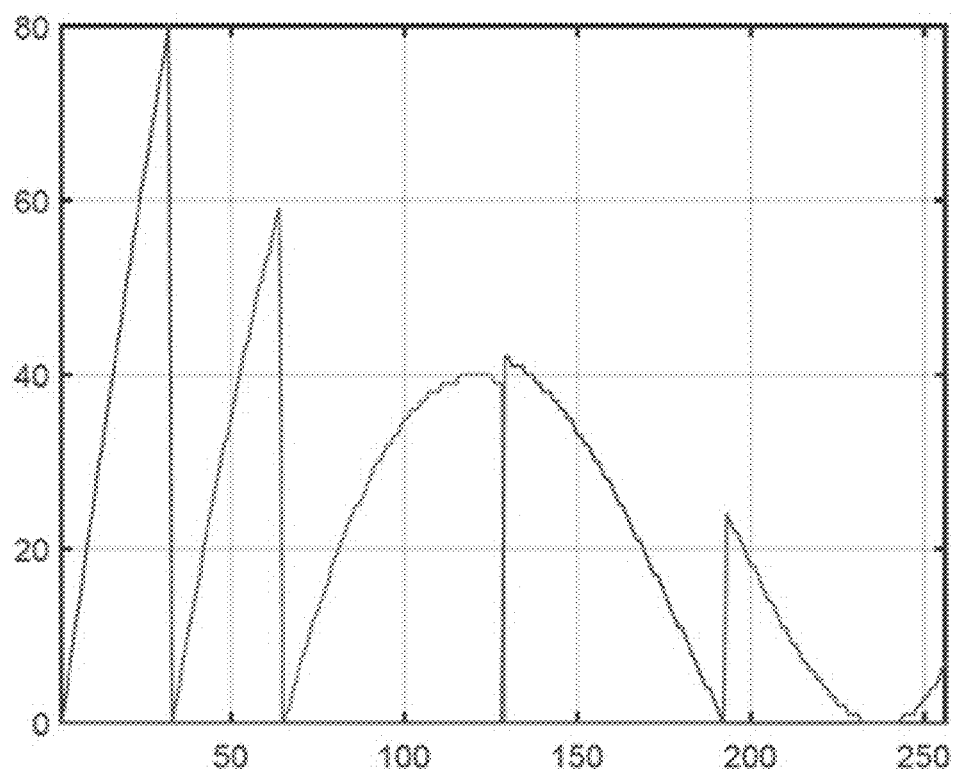
FIG. 20 is a graph illustrating smaller sub-functions without bias.
Figure 21:
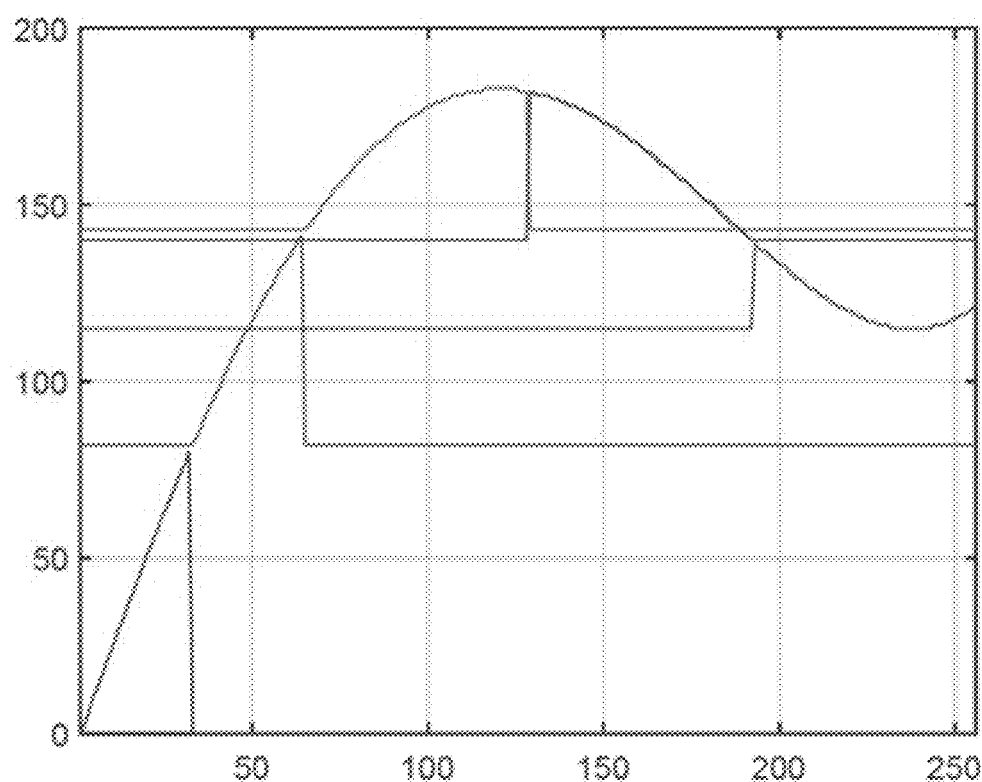
FIG. 21 is a graph illustrating smaller sub-functions with bias.

In some examples, device 100 includes more than one computational unit 120, where each of the computational units includes a scaling network and voting logic. FIGS. 15 and 17 show example circuits including multiple computational units configured to operate in parallel. Each of the computation units may be configured to implement a sub-function, as shown in the graphs of FIGS. 20 and 21. For example, device 100 can receive a binary number and encode a portion of the binary number to a unary bit stream. Each of the computational units can operate on the unary bit stream to produce an output unary bit stream. Device 100 may include a multiplexer to select one of the output unary bit streams based on a second portion of the binary number. Device 100 can also include a second multiplexer to select an offset value to add to the selected output unary bit stream.

For example, computational unit 120 can receive input unary bit stream 110 from an encoder (e.g., a thermometer encoder, an edge-coding encoder, etc.). The encoder may be configured to output input unary bit stream 110 to one or more computational units. Computational unit can generate and deliver output unary bit stream 130 to a multiplexer. The multiplexer can select one of the output unary bit streams, where each output unary bit stream is generated by a computational unit.

Figure 2:
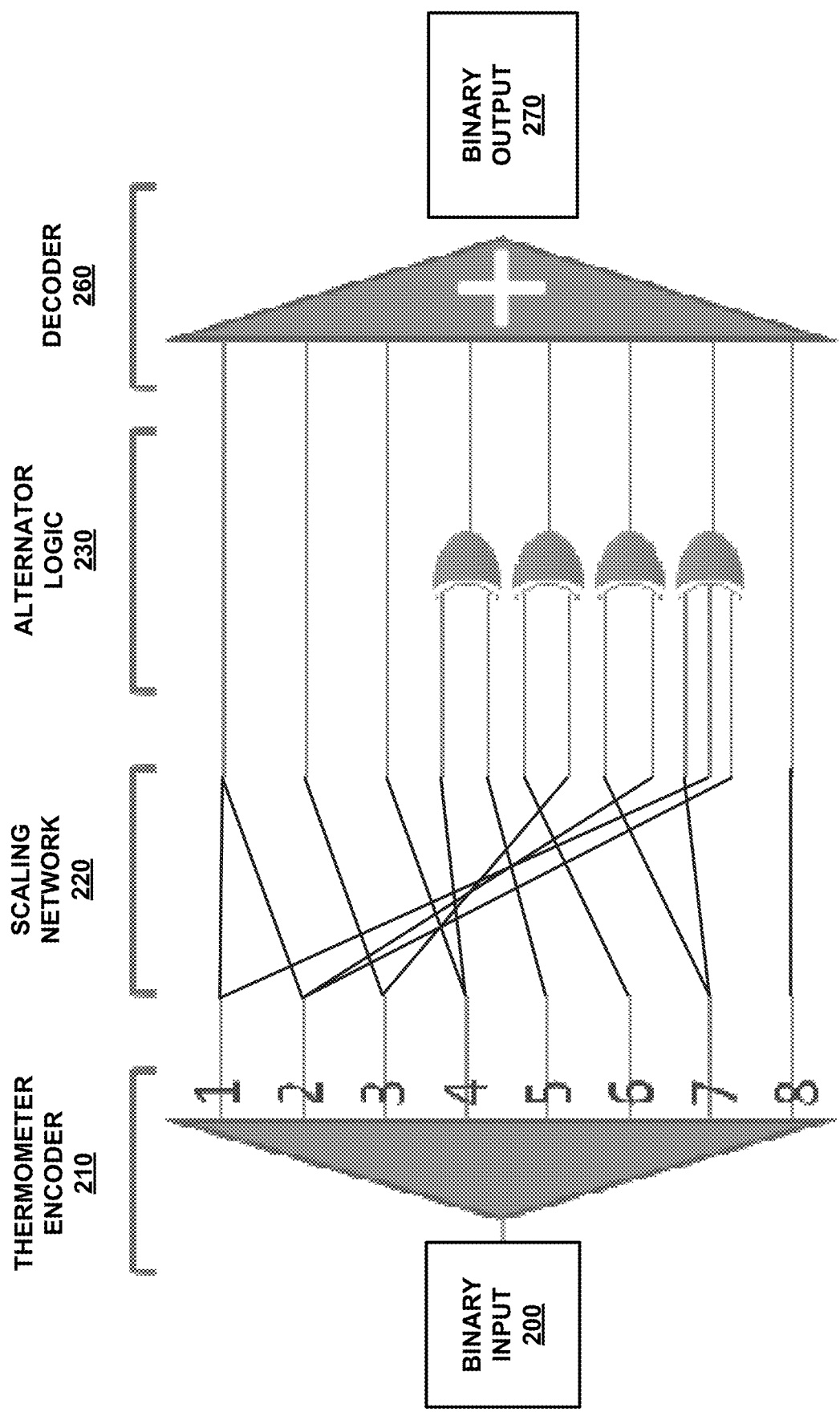
FIGS. 2 and 3 illustrate two possible architectures of a method to perform a computational operation using at least one direct wiring between input and output.
Figure 3:
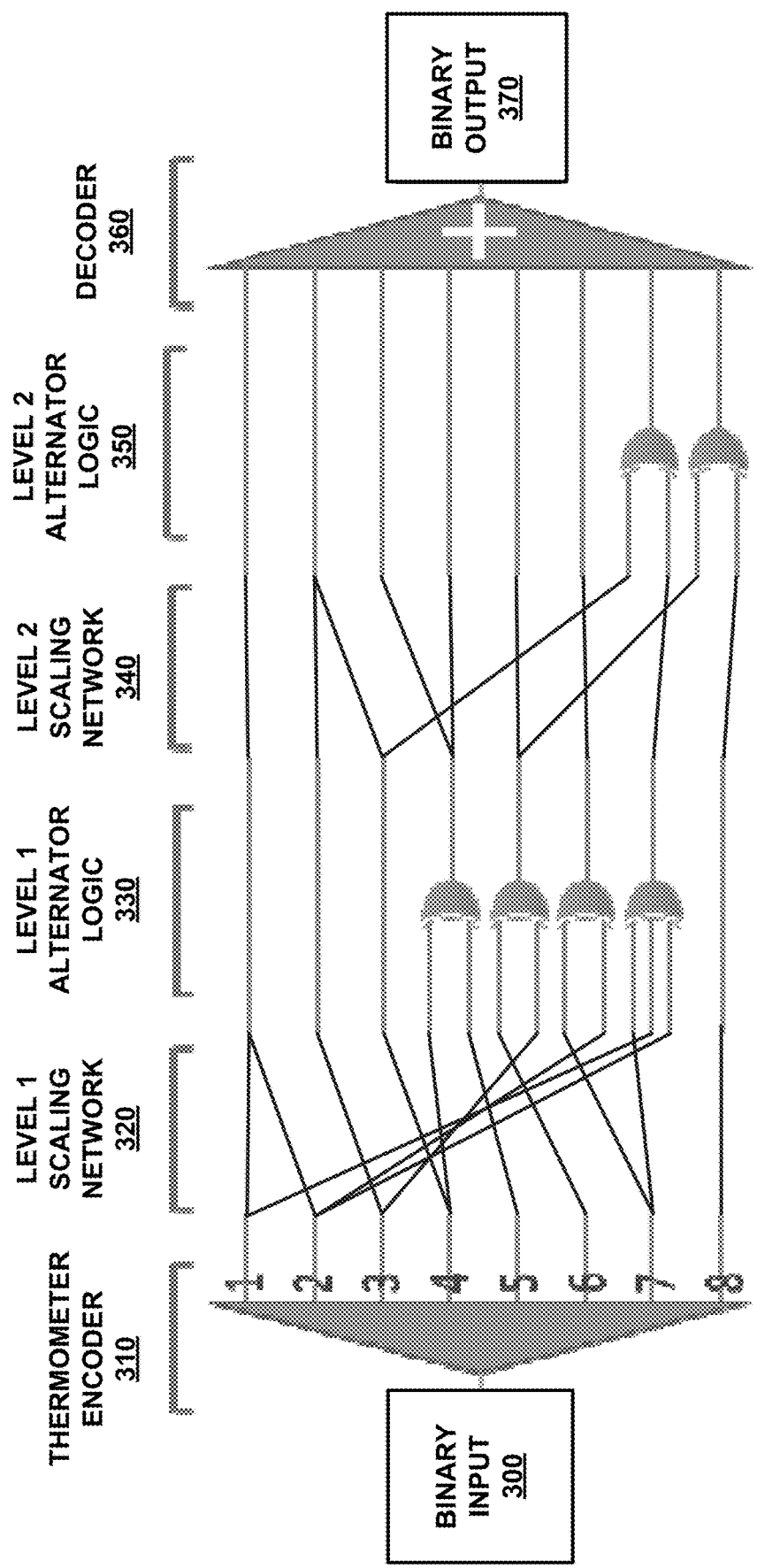

FIGS. 2 and 3 illustrate two possible architectures of a method to perform a computational operation using at least one direct wiring between input and output. As discussed in the introduction, binary numbers are converted to a left-flushed unary number format to make the computation logic simple. FIG. 2 shows the overall architecture of the disclosed techniques. A W-bit binary input value M received at binary input 200 is converted to thermometer code ($2^W$ parallel bits, the first M of which are 1's, and the rest are zeros) at thermometer encoder 210. The circuits shown in FIGS. 2 and 3 have L levels of logic, referred to herein as the "depth" of the circuit. Each depth can implement one function, e.g., Depth 1 can implement Gamma correction, while Depth 2 can implement edge detection on an image. In the context of convolutional neural nets, Depth 1 can implement convolution, while Depth 2 can implement maximum pooling or an activation function. FIG. 2 shows a circuit with one level of depth, and FIG. 3 shows a circuit with two levels of depth. Scaling network 220, which may be referred as a "routing network," designed using the slope (i.e., derivative) of the transfer function takes the parallel bits, stretching or contracting the bits corresponding to monotonically increasing or decreasing regions of the function, feeding the result to alternator logic 230 that decides on the value of each bit based on the region of the function. Finally, the $2^W$ output bits are fed to an adder tree of decoder 260 that converts the output to binary for binary output 270.

If a value is to be evaluated using multiple levels of computations (e.g., first using a Gamma correction filter on an image, and then performing edge detection), the levels can be cascaded without extra conversions between the unary and binary number formats as shown in FIG. 3. To minimize errors, the output of the first level of the alternator (e.g., alternator logic 230) should also be in the canonical unary format. Each depth level of logic may be configured to receive a unary bit stream at the inputs. As mentioned before, this can be guaranteed for all univariate functions and all monotonically increasing multivariate functions. Based on experiments, when bits are not necessarily in the left-flushed format, e.g., when there is an oscillating multivariate function, there will be a small error of about 1% in the calculations of Level 2.

A synthesis method described herein can result in an optimum approximation for computing an arbitrary function f: [0,1]→[0,1], such as $a_i \times x_i$ as part of a convolution operation. The main idea in the disclosed techniques is to utilize the structure of the unary representation, in which each bit of the output contributes 1/N in the value of the function calculated as the sum of all bits. The discrete derivative of function f(x) is defined as shown in Equation (1).

$$\dot{f}(x) = \frac{f(x) - (x - 1/N)}{1/N} = N(f(x) - f(x - 1/N)) \quad (1)$$

Similar to integration, the original function can be recovered from its discrete derivative and an initial value of f(0) using Equation (2).

$$f(x) = \frac{1}{N}\left(Nf(0) + \sum_{y=1}^{x} \dot{f}(y)\right) \quad (2)$$

Assume that a scaling network and alternator logic which is capable of computing y=f(x) is used for Equation (3) to output Equation (4).

$$x = \frac{i}{N} = \underbrace{11\ldots1}_{i}\underbrace{00\ldots0}_{i} \quad (3)$$

$$y = \frac{\lfloor Ny \rfloor}{N} = \underbrace{11\ldots1}_{\lfloor Ny \rfloor}\underbrace{00\ldots0}_{N-\lfloor Ny \rfloor} \quad (4)$$

For $$y' = f(x') = f\left(x + \frac{1}{N}\right) = f(x) + \left(f\left(x + \frac{1}{N}\right) - f(x)\right) = y + \frac{1}{N}\dot{f}\left(x + \frac{1}{N}\right) \quad (5)$$

the seating network should modify the output to Equation (5).

$$x' = x + \frac{1}{N},$$

The difference between the unary representation of x and x' may be only the (i+1)-th bit which is 0 in x, and 1 in x'. This implies that this single bit flip should change the output by $$\dot{f}\left(x + \frac{1}{N}\right)/N.$$

To mimic this analysis in the disclosed network, $$\dot{f}\left(x + \frac{1}{N}\right)/N$$

of the output bits should be set to 1 when the (i+1)-th bit of the input is 1. This technique is further elaborated through a sequence of examples. Starting from the simplest configuration, i.e., the identity function f(x)=x, more sophisticated properties of functions are addressed in the subsequent figures.

Binary inputs 200 and 300 can be a first portion of an input binary number, where the first portion is the lower M bits. The circuits shown in FIGS. 2 and 3 may be one of multiple computational units in an electrical device. Binary outputs 270 and 370 can be fed to a multiplexer that selects a binary output based on a second portion of the input binary number. In some examples, the output unary bit stream generated by alternator logic 230 or 350 may be fed to a multiplexer that selects a unary bit stream based on the second portion of the input binary number. The selected unary bit stream can be decoded to a binary format as binary output 270 or 370.

FIGS. 4A-4C illustrate a scaling network and derivative for an identity function. The simple function of f(x)=x corresponds to the derivative $\dot{f}(x)=1$. Hence each zero-to-one flip in the input (i.e., going from a value of x=p/N to a value of x=(p+1)/N results in a zero-to-one flip in the output (going from f(p) to f(p+1)). To implement this the network directly outputs the input bits. This is illustrated in FIG. 4A for N=100, where on the left the scaling network between the bits of input and output in the unary representation is shown. No alternator logic gates are needed in this case. In the scaling network, the input value is represented using the canonical unary representation (the 1's are grouped together on the left). The output is also in the canonical representations with all the 1's stacked at the bottom of the column. FIG. 4B shows the function itself, and FIG. 4C shows the derivative of the function.

Figure 5A:
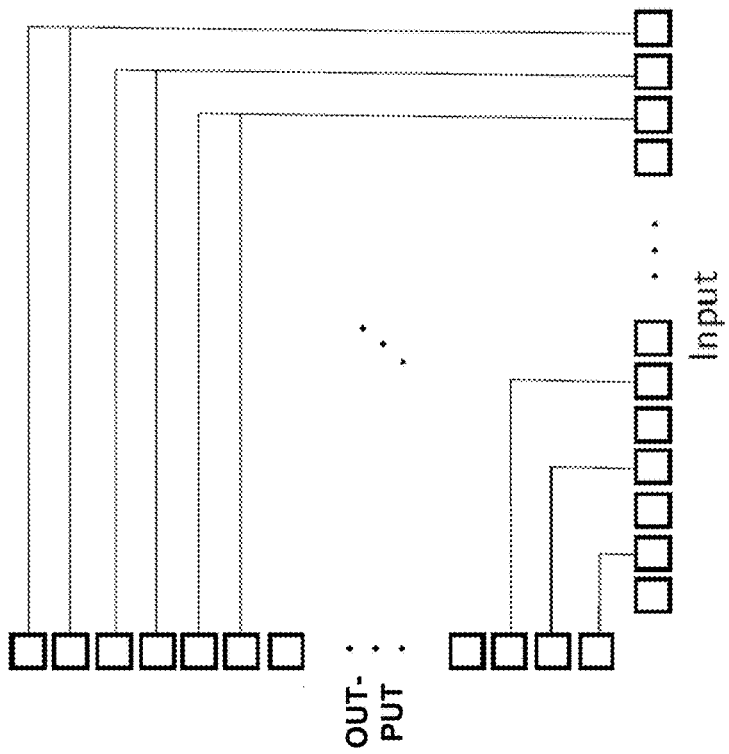
FIGS. 5A-5C illustrate a scaling network and derivative for a piecewise linear function.
Figure 5B:
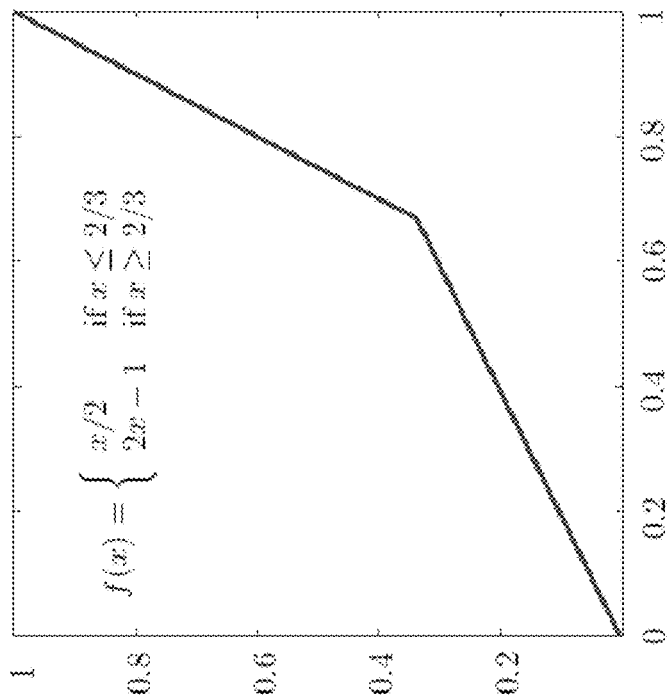
Figure 5C:
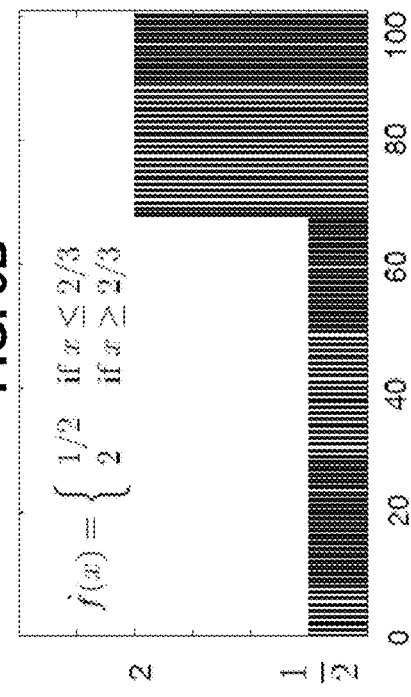

FIGS. 5A-5C illustrate a scaling network and derivative for a piecewise linear function. The transfer function for the piece-wise linear function is shown in Equation (6). Note that this is still a monotonically increasing function with positive but varying derivatives, as shown in Equation (7).

$$f(x) = \begin{cases} x/2 & \text{if } x \leq 2/3 \\ 2x-1 & \text{if } x \geq 2/3 \end{cases} \quad (6)$$

$$\dot{f}(x) = \begin{cases} 1/2 & \text{if } x \leq 2/3 \\ 2 & \text{if } x \geq 2/3 \end{cases} \quad (7)$$

This implies that, for $x \leq 2/3$, a zero-to-one flip must be applied in the output for every two flips in the input. Thus, every other input bit for numerical values below $2/3$ is going to trigger an output bit, such that half of the input bits may not affect the logic value of an output bit. The fanout is proportional to the derivative of the transfer function, which is "½" for input numerical values below $2/3$. On the other hand, when $x \geq 2/3$, every flip in the input results in two flips in the output string. The fanout of the input unary bit stream for numerical values above $2/3$ is two-to-one, such that each input bits may affect the logic value of an output bit. The fanout is proportional to the derivative of the transfer function, which is 2 for input numerical values above $2/3$. This can be done by changing the connections in the scaling network as shown in FIGS. 5A-5C.

FIG. 5A illustrates a scaling network, FIG. 5B illustrates a piecewise linear function, and FIG. 5C illustrates the derivative for the piecewise linear function. FIG. 5B shows the input bits on the horizontal axis of the network with the 1's packed to the left. FIG. 5B also shows the output bits on the vertical axis where the 1's will be packed at the bottom of the column. Every other bit in the input on the left side of the input bits connects to one output bit due to the function's derivative being ½ in the lower region. On the contrary, each bit on the right side of the input bits triggers two output bits, because the derivative is 2 in the upper region. No logic gate is needed to implement this function because the unary representation is simple to operate on. The re-wiring technique discussed above can be applied to any function, as long as the discrete derivative is non-negative. To this end, the zero-to-one routing structure may have to be revised for each bit of the output. This can be easily determined by the discrete derivative of the function.

FIGS. 6A-6C illustrate a scaling network and derivative for a general monotonically increasing function. FIG. 6A shows that the fanout of the input unary bit stream at numerical values near 0.5 may be relatively high, as compared to the fanout of the input unary bit stream at numerical values near zero and one. The derivative of the transfer function may be highest near numerical values of the input unary bit stream near 0.5. FIGS. 6A-6C illustrate the network to compute function in Equation (8).

$$f(x) = \frac{1 + \tanh(4(2x-1))}{2} \quad (8)$$

When $x \approx 0$ as x increases, more input bits flip from 0 to 1, and output bits very gradually start flipping from zero-to-one. The process is guided by the discrete derivative values of the function in this region and the wiring network is essentially contracting input bit bundles when connecting each input bit an output bit node. However, for $x \approx 0.5$, the discrete derivative can be as large as 4, and hence the network consists of four zero-to-one output flips per each input flip (stretching the bundle of neighboring wires when connecting them to output, hence the name "scaling network" used for the routing network shown in FIGS. 2 and 3). "Alternator" gates are still not needed for this transfer function because there is only one input bit stream and because the derivative of the transfer function is not negative at any point.

FIGS. 7A-7C illustrate a scaling network and derivative for a function with an offset. All the functions discussed above have a common property that $f(0)=0$. When $f(0)>0$, the initial $i=[Nf(0)]$ bits of the output should be set to 1 regardless of the input value. These bits are essentially dummy outputs hardwired to '1', that is, the first $i=[Nf(0)]$ output bits are set to 1. A simple example is shown in FIGS. 7A-7C for Equation (9). It is also worth noting that the maximum value the function takes is $f(1)=\frac{3}{4}$. Hence, the last N/4 bits of the outputs are always zero, regardless of the input x.

$$f(x) = \frac{x+1}{3} \quad (9)$$

$$y' - y = \frac{1}{N}\dot{f}\left(x+\frac{1}{n}\right) = f\left(x+\frac{1}{N}\right) - f(x) < 0 \quad (10)$$

For $x=i/N$, at which the function is decreasing, the discrete derivative will be negative at that point. This means once the (i+1)-th bit of the input is set to 1, the output value should decrease by $$\left|\frac{1}{N}\dot{f}\left(x+\frac{1}{n}\right)\right|,$$

which is equivalent to flipping $$\left|\dot{f}\left(x+\frac{1}{n}\right)\right|$$

already set-to-1 bits of the output string back to 0. Recall that a 1 in the output string is set to 1 when it is triggered by another input zero-to-one flip, say X. Thus, output bit can be flipped back to 0 by XORing of the original trigger $X_j$ and the newly observed bit $X_{i+1}$. This only holds due to the left-flushed structure of the inputs which guarantees that $X_j=1$ only when $X_{i+1}=1$. More precisely, an output bit $Y=X_j \oplus X_{i+1}$ takes the values shown in Equation (11).

$$\begin{cases} 0 \leq x \leq \frac{j}{N} \Rightarrow X_j = 0, X_{i+1} = 0 \Rightarrow Y = 0 \\ \frac{j}{N} \leq x \leq \frac{i}{N} \Rightarrow X_j = 1, X_{i+1} = 0 \Rightarrow Y = 1 \\ \frac{i+1}{N} \leq x \leq 1 \Rightarrow X_j = 1, X_{i+1} = 1 \Rightarrow Y = 0 \end{cases} \quad (11)$$

Figure 8A:
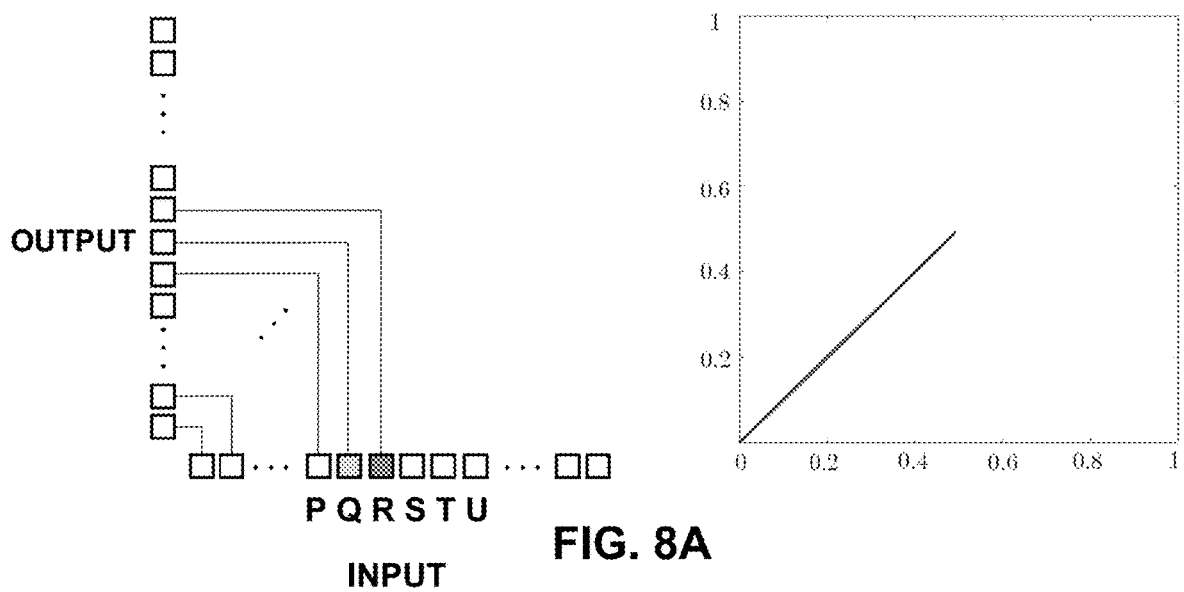
FIGS. 8A-8C illustrate a scaling network and derivative for a function with a negative discrete derivative.
Figure 8B:
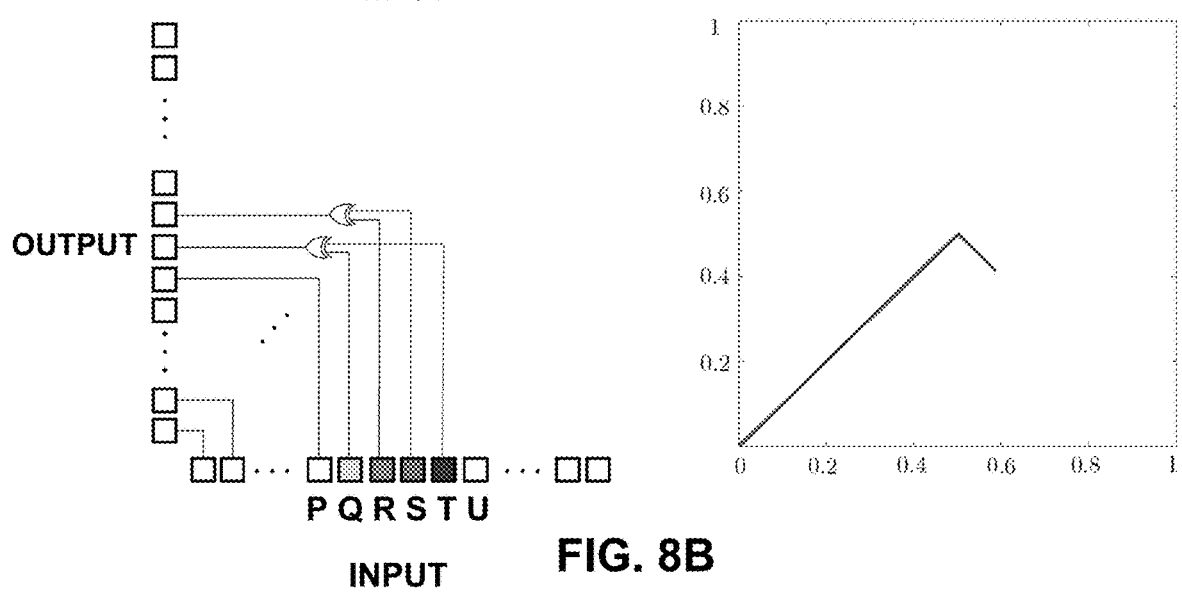
Figure 8C:
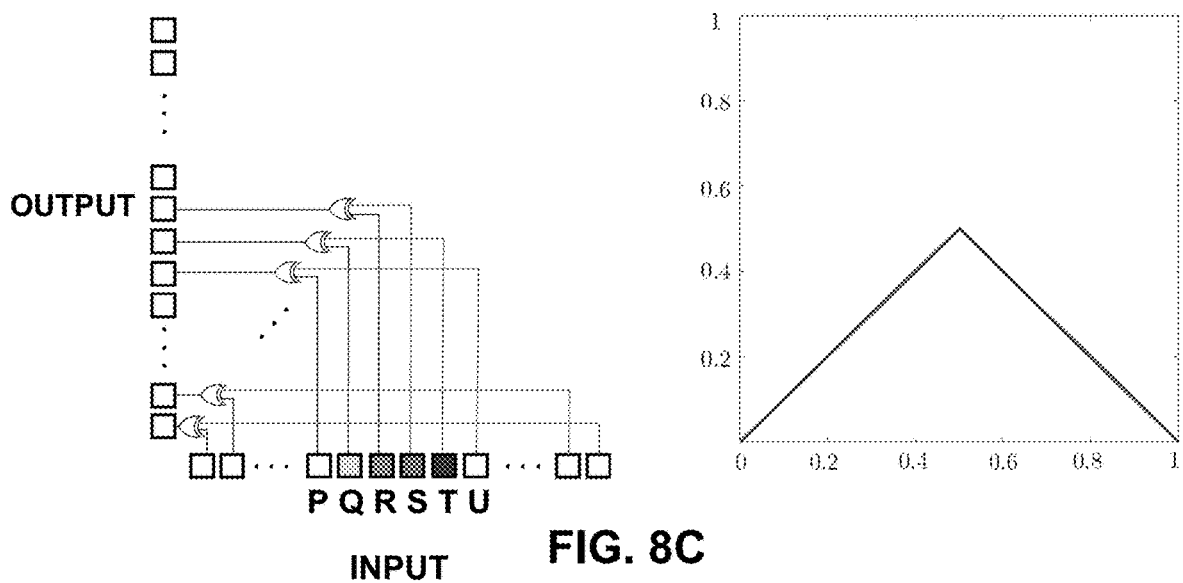

FIGS. 8A-8C illustrate a scaling network and derivative for a function with a negative discrete derivative. FIG. 8A illustrates the increasing part of an identity function, FIG. 8B illustrates the first deductions in the function value, and FIG. 8C illustrates the complete function evaluation. FIGS. 8A-8C show an explicit example of functions with negative discrete derivatives for Equations (12) and (13).

$$f(x) = \frac{1}{2} - \left|x - \frac{1}{2}\right| = \begin{cases} x & \text{if } 0 \le x \le 0.5 \\ 1-x & \text{if } 0.5 \le x \le 1 \end{cases} \quad (12)$$

$$\dot{f}(x) = \begin{cases} 1 & \text{if } 0 \le x \le 0.5 \\ -1 & \text{if } 0.5 \le x \le 1 \end{cases} \quad (13)$$

In FIG. 8A, the scaling network is designed for $x \in [0, 0.5]$, with $\dot{f}=1$, and x E [0.5, 1], with $\dot{f}=-1$, similar to the increasing functions discussed above. As the network is built for values $x > \frac{1}{2}$, "alternator" XOR gates must be added to make sure the function value is correct in all regions of the function. When the thermometer code sets input bit R to 1 and input bit S to 0 (x=0.5), the output of the XOR is 1, which is correct. However, for an input value x=0.5+1/N, f(x) should be $$\frac{1}{N}$$

less than f(0.5), which means the last 1 bit that was added because of input bit R, has to be canceled, hence XORing input bits R and S. The same process is used on input bits Q and T: input bit Q sets the output, and input bit T resets it. Continuing this modification on the remaining gates, the network in FIG. 8C was obtained, which can compute the function for all $x \in [0, 1]$. Note that there is no sequential process here: the thermometer code does not progressively change the values of input bits Q, R, S, and T. The input bits all take their values in one cycle and the XOR gates do the voting in parallel. Also note that the final output will still be in the canonical unary format.

With respect to FIGS. 8A-8C, functions were discussed that are increasing and then decreasing. In general, a function can go up and down multiple times. The XOR gate discussed above allows the output bit to switch between 0 and 1 for an arbitrary number of times, only changing the fan-in of the alternator gate. The gate output should be set to 1 whenever function increases, and to 0 whenever it decreases. It should be set back to 1 if the function started going up again.

FIGS. 9A-9C illustrate a scaling network and derivative for an oscillating function. The implementation of an arbitrary function is demonstrated in FIGS. 9A-9C. As shown in the figure, function f(•) is increasing in regions (a) and (b), decreasing in region (c), and again increasing in regions (d) and (e). However, there is a fundamental difference between regions (d) and (e): In region (d) the function value is still below the maximum value that function has taken up to that point. Hence, in order to construct f(x) one needs to make sure that the already defined gates now output ones. In region (e), however, the function value is greater than the maximum value the function has taken up to that point. Hence, even if all the predetermined gates are set to 1, the circuit still cannot keep up with the growth of the function, and thus new direct line connections should be added to set the corresponding output bits to 1 when the thermometer code sets the right-most group of bits of the input to 1. The first bit of the input in region (e) is set to one by the thermometer coding circuit, the corresponding output bit should be set to one using a direct wire with no logic.

A technique similar to what was described above can be utilized to design a network to evaluate/approximate a multivariate function. Recall the basic ingredients of circuit development for a univariate function: (1) an output bit $Y_i$ is triggered by an $X_j$ when x=j/N is the first time the function value exceeds y=i/N, and (2) after being triggered, output bits are alternated by multiple input bits through XOR operations to mimic the increasing and the decreasing behavior of the function of interest.

A similar recipe can be used to design a circuit for multivariate functions: output bits are set by a tuple from the function inputs. Such tuple is implemented by ANDing a subset of the input bits, one from each of the function inputs. For a relatively simple class of monotonically increasing functions, no alternating is needed, and only the triggering points for each output bit must be properly determined. However, the main difference is that the notion of "the first time the function exceeds a certain value" is not meaningful. A simple example of designing a circuit is for the function z=f(x,y)=10x·y with unary bit length of N=10. This function reaches z=0.4 at $(x,y) \in \{(0.1, 0.4), (0.2, 0.2), (0.4, 0.1)\}$, where one cannot establish an ordering of these tuples. Hence, $Z_4$ should be triggered by either of such combinations. This can be implemented by Equation (14).

$$Z_3 = (X_1 \wedge Y_4) \vee (X_2 \wedge Y_2) \vee (X_4 \wedge Y_1) \quad (14)$$

Once an output bit is triggered, it can alternate between zero and one frequently by XORing the original triggering sequence by all alternators. It is worth noting that each alternator input is again a tuple of input bits, one from each function input. In the following, an example is presented, and N=4 is assumed for the sake of simplicity. An output gate defined as Equation (15).

$$Z = [(X_1 \wedge Y_3) \vee (X_2 \wedge Y_1)] \oplus (X_2 \wedge Y_2) \oplus (X_3 \wedge Y_4) \quad (15)$$

FIGS. 10A-10C illustrate a scaling network and derivative for function with more than one input unary bit stream, i.e., more than one input variable. FIG. 10A shows the triggering of the gate, FIG. 10B shows alternations, and FIG. 10C shows the gate value determined by the tables in FIGS. 10A and 10B. An output logic value of one is triggered in FIG. 10A when bit $X_2$ or bit $Y_3$ have a logic value of one. The output logic value alternates when both $X_2$ and $Y_2$ have logic values of one and alternates again when both $X_3$ and $Y_4$ have logic values of one.

The output gate in Equation (15) gets triggered by either of $(X_1, Y_3)=(1,1)$, i.e., $(x,y)=(\frac{1}{4}, \frac{3}{4})$ or $(X_2, Y_1)=(1,1)$, i.e., $(x,y)=(\frac{1}{4},\frac{1}{4})$. After being triggered by $(X_2,Y_1)$, it will be switched back to zero by $(X_2,Y_2)=(1,1)$, i.e., $(x,y)=(\frac{2}{4},\frac{2}{4})$. Later at $(X_3,Y_4)=(1,1)$, i.e., $(x,y)=(\frac{3}{4},\frac{4}{4})$, it will again take the value one. The behavior of this output gate is shown in FIGS. 10A-10C. As a practical example, the design of a function is described that computes the median of nine inputs, A, B, H, and I. z=median(a, b, c, . . . , h, i) can be computed and represented in N-bit unary format, given by Equation (16).

$$Z_i = \begin{cases} 0 & \text{if } 0 \le \text{sum}(A_i, B_i, \ldots, I_i) \le 4 \\ 1 & \text{if } 5 \le \text{sum}(A_i, B_i, \ldots, I_i) \end{cases} \quad (16)$$

In other words, if at least 5 out of the nine bits at position k are 1, the output at that bit position is 1. In this example, Zk only depends on the k-th bit of the inputs, and hence, the corresponding adder tree has only nine inputs. Calculation of the median filter in the unary format is almost trivial due to the fact that the unary representation has already "unpacked" the bits from binary, hence making the sorting problem needed in a conventional binary approach redundant. Intuitively, the nine canonical unary values as a set of vertical bar graphs is visualized, and swept from bottom-up using a horizontal cut line, the first time a point is reached where only four of the bars are still cutting the horizontal cut line is the point that has passed exactly five smallest values behind, and the horizontal cut line shows the value of the fifth bar graph.

TABLE 1

The functions used to evaluate the scaling networks disclosed herein.

| Function Name | Equation |
|---|---|
| $\gamma(x)$ | $x^{0.45}$ |
| tanh | $(1 + \tanh(4(2x - 1)))/2$ |
| cosh | $\cosh(x) - 1$ |
| exp | $e^{(x - 1)}$ |
| $f_{x6}(x)$ | $\mu x(1 - x)$ |
| sin | $(\frac{1}{2}) \times (1 + \sin(15x))$ |
| M-shaped | $30x(1 - x)(x - 0.4)^2$ |
| Robert's Cross edge detection | $\sqrt{(x_{TL} - x_{BR})^2 + (x_{TR} - x_{BL})^2}$ |
| Median | $\text{Median}(x_1, x_2, \ldots, x_9)$ |

The disclosed techniques were compared to previous stochastic works that include Bernstein Polynomial implementation, state-machine-based methods, combinational logic implementing Maclaurin series, dynamical systems with feedback, and the recent parallel implementation of stochastic logic. The unary method described herein is not restricted to the class of Bernstein Polynomials. None of the previous stochastic methods can implement the functions shown in FIGS. 12A and 12B, which are not Bernstein functions. Bernstein functions can only touch the x-axis at either x=0 or x=1, and the two functions in FIGS. 12A and 12B clearly have y=0 for values of x other than zero and one. Furthermore, Bernstein polynomials approximate functions, whereas the method described herein can implement the functions with no approximation errors.

Table I shows the functions used to compare the disclosed techniques against previous work. The names used to refer to functions are listed in the first column. The second column shows the corresponding real-valued functions. In addition to previous stochastic implementations, the disclosed work is compared against conventional binary implementations. The Robert's Cross edge detection algorithm may take four pixels $x_{TL}$, $x_{BR}$, $x_{TR}$, $x_{BL}$ as input. The subscripts T, B, L, R correspond to top, bottom, left and right. The median filter finds the median pixel value in a 3×3 window.

Figure 11A:
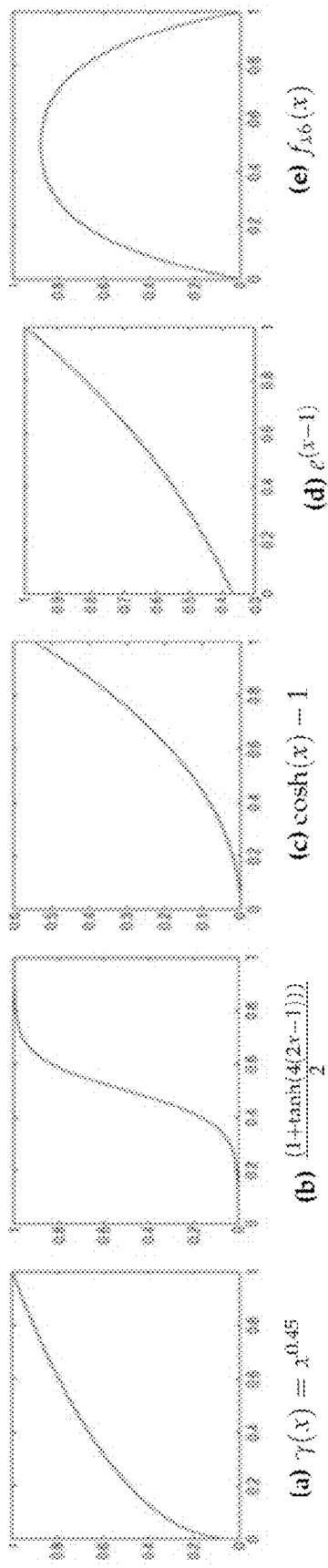
FIGS. 11A and 11B include graphs illustrating three methods of performing operations.
Figure 11B:
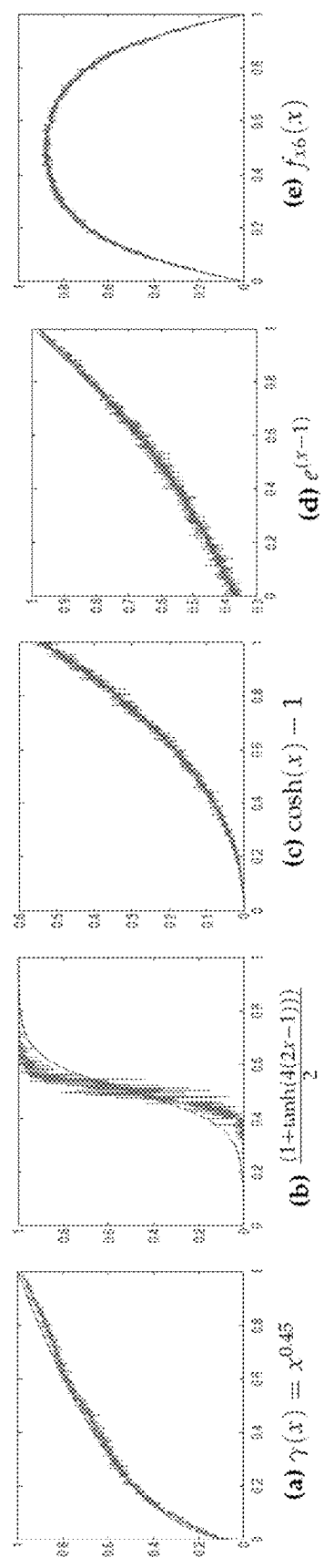

The disclosed techniques were compared to the previous work in terms of accuracy of computation, hardware resource usage and computation latency. The accuracy comparisons were done using 10-bit binary resolutions (FIGS. 11A and 11B and Table II). Image processing applications such as Gamma correction, Robert's cross and median were done using an 8-bit resolution. Hardware comparisons were done using 8-, 10-, and 12-bit resolutions.

Table II shows the mean absolute error (MAE) numbers of the disclosed techniques and previous work. The "This work" column shows the results of the disclosed architecture of FIG. 2 with N=1024 parallel input bits. The disclosed techniques are about 1-2 orders of magnitude more accurate compared to previous work. Further example details of stochastic-computing-based approximations of the functions in Table II can be found in "An Architecture for Fault-Tolerant Computation with Stochastic Logic" by Qian et al., IEEE Transactions on Computers, volume 60, no. 1, pages 93-105 (2011), "Randomness meets feedback: Stochastic implementation of logistic map dynamical system" by Wang et al., Design Automation Conference (DAC), June 2015, "Computing Polynomials with Positive Coefficients using Stochastic Logic by Double-NAND Expansion" by Salehi et al., Proc. of the on Great Lakes Symposium on VLSI, pages 471-474 (2017), and "Logical Computation on Stochastic Bit Streams with Linear Finite State Machines" by Lilj a et al., IEEE Transactions on Computers, volume 63, no. 6, pages 1473-1485, June 2014, each of which is incorporated herein by reference in its entirety. All experiments in this subsection were done in MATLAB. For previous stochastic computing work random bit streams were generated using MATLAB's rand function (in practice, low-cost linear-feedback shift registers (LFSRs) are used in stochastic computing, which have lower quality).

In certain example implementations described herein, on average, the disclosed techniques have an area×delay cost that is very small (e.g., only 3%) of that of conventional binary implementations with a resolution of 8 bits. Although the disclosed techniques are still competitive for higher resolutions, the gap between the conventional binary and the disclosed techniques shrinks as the resolution goes higher (the costs of the disclosed techniques are 8% and 32% of the conventional at 10- and 12-bit resolutions). Thus, the thermometer code and parallel implementation of logic can result in area×delay benefit of 33×, 12.5×, and 3× for resolutions of eight-, ten-, and twelve-bit binary.

Furthermore, using a hybrid binary-unary architecture can result in 99.92%, 99.72% and 92.59% area×delay cost reduction over conventional binary at binary resolutions of 8, 10, and 12 bits, respectively. The hybrid binary-unary architecture includes conversion from binary to unary, and conversion from unary to binary. The hybrid binary-unary architecture described herein also includes using multiple sub-functions, rather than a single function implementation, to approximate a target function. Deep learning applications, embedded vision, image and data processing, edge computing, and internet of things (IoT) applications are good candidates for the techniques described herein.

FIGS. 11A and 11B include graphs illustrating two methods of performing operations. FIGS. 11A and 11B and Tables II and III (below) compare the techniques described herein to stochastic computing and to conventional binary implementations on a number of functions, as well as on two common image processing applications. The techniques disclosed herein may have smaller area-delay products, as compared to a conventional binary implementation: the area×delay cost of the disclosed techniques may be on average only 3%, 8% and 32% of the binary method for 8-, 10-, and 12-bit resolutions respectively. Compared to stochastic computing, the cost of the techniques disclosed herein may be 6%, 5%, and 8% for those resolutions. The area cost includes conversions from and to the binary format. The techniques disclosed herein outperform the conventional binary method on an edge-detection algorithm. However, the techniques disclosed herein may not be competitive with the binary method on the median filtering application due to the high cost of generating and saving unary representations of the input pixels.

Figure 12B:
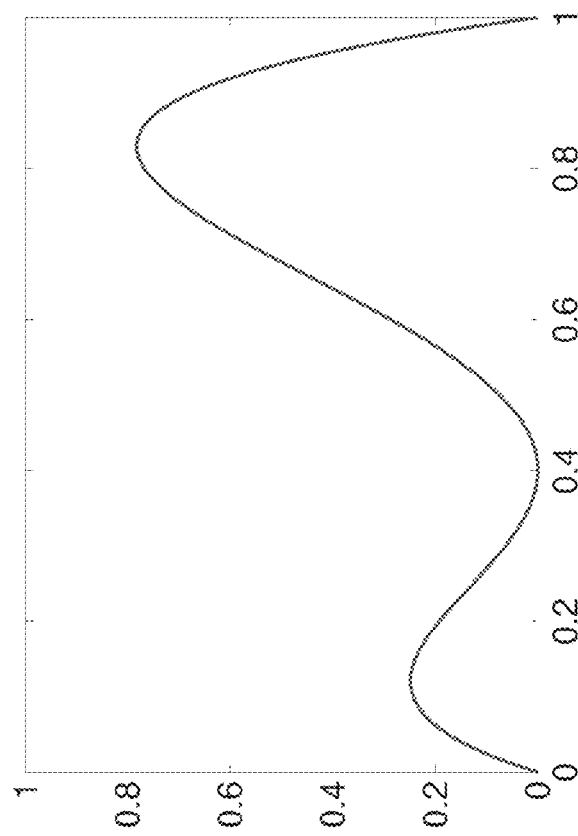
FIGS. 12A and 12B illustrate approximation of an oscillating function.
Figure 12A:
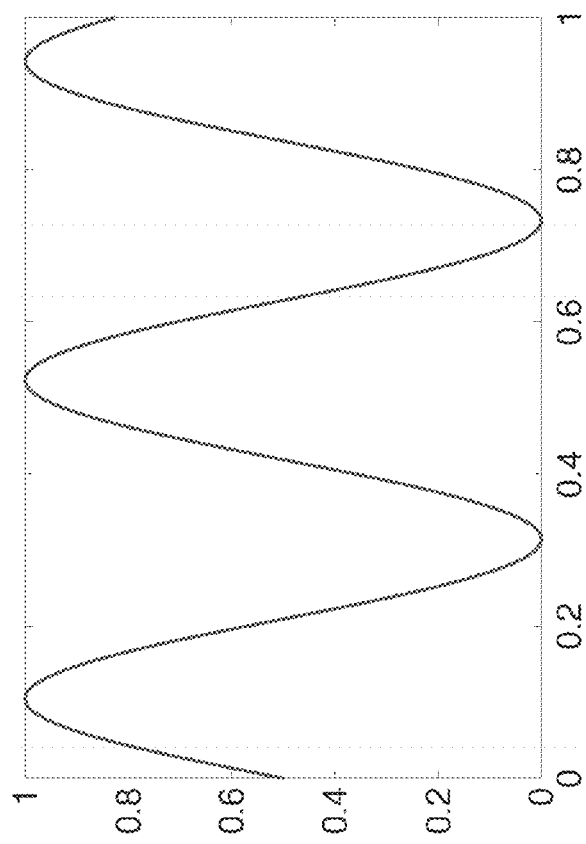

FIG. 11A shows the results from an example of this disclosure, FIG. 11B shows results from previous serial stochastic methods. FIGS. 11A and 11B show graphs of the functions using the disclosed techniques (top row) and previous work (bottom row). It can be seen that the disclosed techniques show significantly smaller approximation errors. FIGS. 12A and 12B illustrate approximation of an oscillating function, that cannot be implemented using previous stochastic computing methods.

TABLE 2

The mean absolute error (MAE) between the real-valued functions and various approximations

| Function | This work | Previous Parallel Stochastic | Previous stochastic |
|---|---|---|---|
| γ(x) | $2.39 \times 10^{-4}$ | $2.45 \times 10^{-2}$ | $2.10 \times 10^{-2}$ |
| tanh | $2.49 \times 10^{-4}$ | $1.74 \times 10^{-2}$ | $4.59 \times 10^{-2}$ |
| cosh | $2.40 \times 10^{-4}$ | $4.50 \times 10^{-3}$ | $7.45 \times 10^{-3}$ |
| exp | $2.42 \times 10^{-4}$ | $7.69 \times 10^{-2}$ | $1.24 \times 10^{-2}$ |
| $f_{x6}(x)$ | $2.42 \times 10^{-4}$ | $5.29 \times 10^{-3}$ | $9.84 \times 10^{-3}$ |
| sin | $2.41 \times 10^{-4}$ | — | — |
| M-shaped | $2.47 \times 10^{-4}$ | — | — |

All designs were implemented in Verilog and compiled on Kintex 7 XC7K325T-1FFG900C FPGAs using the Xilinx Vivado default design flow (by Xilinx, Inc. of San Jose, Calif.). Three methods were used to implement each function: W-bit wide conventional binary, $2^W$-bit serial stochastic (previous work) and the disclosed techniques: $2^W$-bit unary encoding, and set W=8, 10, 12. Table IV shows the area and delay results, and is divided into three groups for each resolution. Columns 2-4 show the number of lookup tables (LUTs) and flip-flops (FFs) used to implement the function, and the critical path delay. Column 5 labeled "Cy" shows the number of clock cycles needed to calculate the function (more details below). The A×D column shows the area× delay product, which is the multiplication of the LUT, Delay, and Cy columns. Finally, the "Ratio" column shows the ratio of the previous stochastic and the disclosed techniques to the conventional binary.

For the conventional implementation of tan h, cos h and exp, both polynomial approximation and CORDIC (Coordinate Rotation Digital Computer) were applied, and in all three cases CORDIC resulted in better area×delay, so CORDIC was used for those functions. It takes W iterations of CORDIC to evaluate cos h and exp, hence the number W under the "Cy" column for these designs. For tan h, an additional W cycles are needed to perform division using CORDIC. For the previous stochastic methods, the circuit was implemented and LFSRs were used for the random number generators. For the implementation of the functions, the architecture of FIG. 2 was used, including the thermometer encoder and the decoder.

In various example implementations described above with respect to FIGS. 11A, 11B, 12A and 12B, a device of this disclosure may take only 3% of the A×D of the conventional binary method, and 6% of previous stochastic approaches on average for an 8-bit resolution. When the resolution gets higher, stochastic methods start to perform increasingly worse compared to their binary counterparts, as the number of cycles in stochastic logic increases exponentially. The disclosed techniques may also suffer from an exponential increase in the size of the scaling network and the alternating logic. The disclosed techniques still outperforms the conventional binary implementation (8% and 32% of the cost in terms of A×D at resolutions of 10 and 12 bits), but the disclosed techniques may not be competitive with conventional binary implementations for higher resolutions such as W=16. For reference, parallel stochastic methods may have 14% the A×D of the conventional binary at W=10, compared to the disclosed 8% ratio.

Figures 13A, 13B:
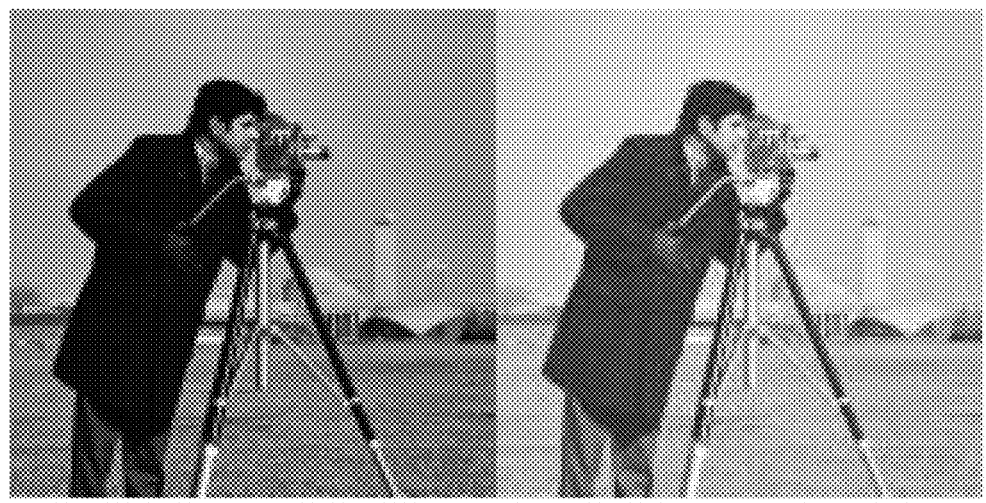
FIGS. 13A-13D, 14A, and 14B illustrate image processing examples for the techniques of this disclosure.
Figures 13C, 13D:
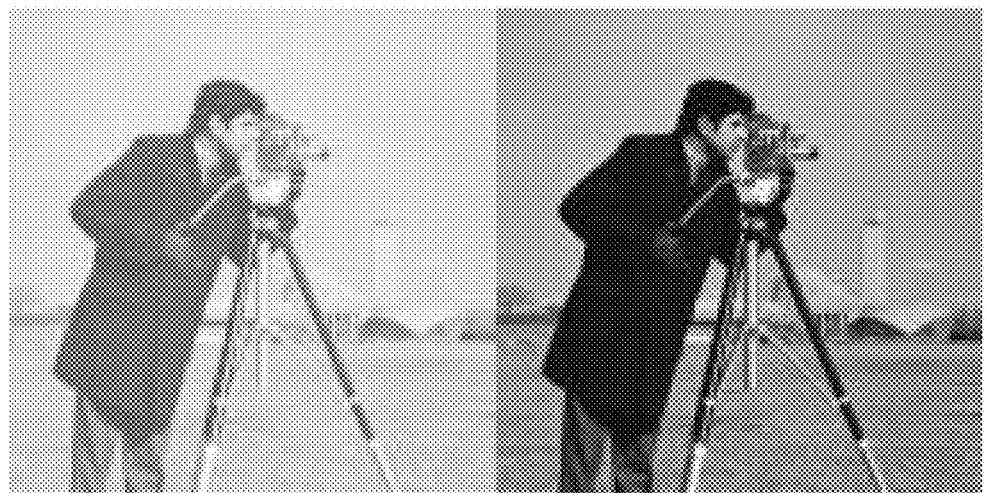
Figures 14A, 14B:

FIGS. 13A-13D, 14A, and 14B illustrate image processing examples for the techniques of this disclosure. MATLAB simulations were used to generate the images using the architectures of FIGS. 2 and 3. FIGS. 13A-13D illustrate gamma correction, which may only use one level of logic. FIG. 13A illustrates the original image, and FIG. 13B illustrates gamma correction 0.45 with an average error of 0.15%. FIG. 13C illustrates gamma correction 0.25 with an average error of 0.23%, FIG. 13D illustrates gamma correction 0.75 with an average error of 0.17%. FIGS. 14A and 14B illustrate Robert's Cross edge detection, where FIG. 14A illustrates the original image, and FIG. 14B illustrates edge detection with an average error of 1.1%.

An attempt was made to implement the Robert's Cross algorithm using a one-level network with four unary inputs. However, that resulted in a complex circuit that would take the disclosed synthesis method a long time to generate, and the program was terminated after about 15 minutes. Then a two-level network was attempted (e.g., FIG. 3): in the first level the square of differences is calculated, and in the second level the square root of the sum is calculated. The network was designed in such a way that the output of the first level was in the canonical unary format. That architecture created a maximum fanout of 2000 for the XOR gate of the Level 1 network. Relaxing the canonical format resulted in much better maximum fanout of 250. The penalty for not using the canonical unary format may be the introduction of errors in the calculation.

FIGS. 13A-13D shows the original image, and the output of three different scaling networks designed for different gamma values. The average error of all cases are below 0.25%. FIGS. 14A and 14B shows the output of the Robert's Cross algorithm using the disclosed two-level network. It can be seen that the error rose to 1.1%, which is due to the use of a non-canonical two-level network as discussed above.

Table III shows the hardware comparison of the disclosed techniques against the conventional binary method for the image processing applications. Three thermal encoder units were used in the disclosed median filter implementation for the three new pixels that are introduced as the 3×3 pixel window moves across the image. Six 256-bit registers are allocated to hold the values of the old pixels from the previous location of the window. The high cost of generating/storing the unary representations may put the disclosed techniques at a disadvantage: the disclosed techniques have 80% higher cost compared to the binary method. In the case of the conventional binary Robert's Cross method, a CORDIC unit was used to calculate the square root, hence the 16 cycles that do not allow us to use pipelining and increase throughput. The disclosed techniques have 26% of the cost of the conventional method.

TABLE 3

Image processing hardware comparisons.

| Function | LUT | FF | Delay | Cycle | A × D | Ratio |
|---|---|---|---|---|---|---|
| Conventional Robert Cross | 1218 | 276 | 9.10 | 16 | 177340.80 | 1.00 |
| Proposed Robert Cross | 8240 | 791 | 5.73 | 1 | 47215.20 | 0.26 |
| Conventional Median Filter | 421 | 8 | 15.45 | 1 | 6504.45 | 1.00 |
| Proposed Median Filter | 1723 | 2058 | 5.76 | 1 | 11854.08 | 1.8 |

This disclosure has described techniques that convert binary input to the canonical unary format and synthesize a scaling network and alternator logic to implement complex functions using much smaller area compared to conventional binary, especially for 8-bit and 10-bit resolutions. The disclosed techniques achieve much smaller area×delay products compared to the binary methods. This approach takes advantage of two main features of FPGAs: the abundance of routing resources that can handle large fanouts (especially needed in multi-variate functions), and large fan-in LUTs.

lower M bits (e.g., the least significant M bits) and the upper N minus M bits (e.g., the most significant N-M bits). The upper bits (e.g., a first subset of binary bits) are fed forward to multiplexer 1560, while the lower bits (e.g., a second

TABLE 4

FPGA area and delay results. The techniques of this disclosure are compared against the conventional binary and previous stochastic computing methods. All of the techniques of Table 4 are implemented on the same FPGA chip.

| Func | LUT | FF | Delay | Cy | A × D | Ratio | LUT | FF | Delay | Cy | A × D | Ratio | LUT | FF | Delay | Cy | A × D | Ratio |
|---|---|---|---|---|---|---|---|---|---|---|---|---|---|---|---|---|---|---|
| | Conventional Binary Architecture with W = 8 | | | | | | Conventional Architecture with W = 10 | | | | | | Conventional Architecture with W = 12 | | | | | |
| γ | 5944 | 8 | 24.00 | 1 | 143k | 1 | 11335 | 10 | 29.99 | 1 | 340k | 1 | 14504 | 12 | 30.42 | 1 | 441k | 1 |
| tanh | 1193 | 260 | 9.10 | 16 | 174k | 1 | 1193 | 260 | 9.10 | 20 | 217k | 1 | 1193 | 260 | 9.10 | 24 | 261k | 1 |
| cosh | 1193 | 260 | 9.10 | 8 | 87k | 1 | 1193 | 260 | 9.10 | 10 | 109k | 1 | 1193 | 260 | 9.10 | 12 | 130k | 1 |
| exp | 1203 | 270 | 9.10 | 8 | 88k | 1 | 1203 | 270 | 9.10 | 10 | 109k | 1 | 1203 | 270 | 9.10 | 12 | 131k | 1 |
| M_Sh | 880 | 8 | 17.35 | 1 | 15k | 1 | 1380 | 10 | 22.52 | 1 | 31k | 1 | 1907 | 12 | 23.37 | 1 | 45k | 1 |
| Avg | | | | | 101k | 1 | | | | | 134k | 1 | | | | | 202k | 1 |
| | Previous Stochastic Work with W = 8 | | | | | | Previous Work with W = 10 | | | | | | Previous Work with W = 12 | | | | | |
| γ | 92 | 81 | 4.32 | 256 | 102k | 0.71 | 92 | 81 | 4.32 | 1024 | 407k | 1.19 | 92 | 81 | 4.32 | 4096 | 1628k | 3.69 |
| tanh | 111 | 10 | 1.10 | 256 | 31k | 0.18 | 111 | 10 | 1.10 | 1024 | 125k | 0.57 | 111 | 10 | 1.10 | 4096 | 500k | 1.91 |
| cosh | 154 | 99 | 0.99 | 256 | 39k | 0.45 | 154 | 99 | 0.99 | 1024 | 156k | 1.44 | 154 | 99 | 0.99 | 4096 | 624k | 4.79 |
| exp | 100 | 70 | 0.98 | 256 | 25k | 0.28 | 100 | 79 | 0.98 | 1024 | 100k | 0.92 | 100 | 70 | 0.98 | 4096 | 101k | 3.06 |
| M_Sh | Can't implement this kind of function | | | | | | Can't implement this kind of function | | | | | | Can't implement this kind of function | | | | | |
| Avg | | | | | 49k | 0.49 | | | | | 197k | 1.47 | | | | | 788k | 3.91 |
| | Our Architecture with W = 8 | | | | | | Our Architecture with W = 10 | | | | | | Our Architecture with W = 12 | | | | | |
| γ | 290 | 195 | 5.75 | 1 | 1.6k | 0.01 | 918 | 72 | 8.01 | 1 | 7.4k | 0.02 | 2243 | 1738 | 8.12 | 1 | 18k | 0.04 |
| tanh | 208 | 150 | 5.32 | 1 | 1.1k | 0.01 | 813 | 652 | 7.67 | 1 | 6.2k | 0.03 | 1534 | 130 | 8.25 | 1 | 13k | 0.05 |
| cosh | 218 | 194 | 5.19 | 1 | 1.1k | 0.01 | 840 | 710 | 7.43 | 1 | 6.2k | 0.06 | 4520 | 3960 | 8.76 | 1 | 39k | 0.39 |
| exp | 253 | 216 | 5.48 | 1 | 1.3k | 0.02 | 858 | 70 | 7.73 | 1 | 6.6k | 0.06 | 4652 | 4008 | 8.80 | 1 | 41k | 0.31 |
| M_Sh | 301 | 203 | 5.56 | 1 | 1.6k | 0.11 | 884 | 404 | 7.67 | 1 | 7.4k | 0.24 | 4700 | 3746 | 8.54 | 1 | 40k | 0.90 |
| Avg | | | | | 1.4k | 0.03 | | | | | 6.8k | 0.08 | | | | | 30k | 0.32 |
| | Our method/prev stochastic | | | | | 0.06 | | | | | | 0.05 | | | | | | 0.08 |

In the following description, additional examples are described with respect to the processing of data using scaling circuitry and voting circuitry. In some examples, a thermometer encoder is configured to convert the lower portion of a binary number to a unary bit stream for processing by a plurality of scaling circuitry and voting logic circuitry. Additionally or alternatively, other computational circuitry that does not include scaling circuitry or voting logic circuitry can process the unary bit stream. The remainder of the binary number is used to select one of the unary circuitry and a binary bias to be added to the output of the decoder.

As further described below, computation on a set of data bits can include both computation on a binary-encoded set of bits and computation on a unary-, deterministic-, or stochastic-encoded set of bits. This computational architecture is referred to herein as the hybrid binary-unary architecture, but the architecture may instead be a hybrid binary-deterministic architecture or a hybrid binary-stochastic architecture.

FIG. 15 is a conceptual block diagram of a hybrid binary-unary architecture, in accordance with some examples of this disclosure. The hybrid binary-unary architecture described with respect to FIG. 15 is by way of example to the scaling networks of FIGS. 1-10, although computational units 1520 do not necessarily include scaling networks.

Input circuitry 1502 may be configured to store a set of binary bits and convert a first subset of the binary bits to an input unary bit stream. Input circuitry 1502 can include N-bit binary register 1500 and encoder 1510. N-bit binary register 1500 stores a binary number with two portions, the subset of binary bits) are fed to encoder 1510, which can convert the lower M binary bits to a unary bit stream.

Unary processing circuitry 1522 may be configured to perform operations on the input unary bit stream received from input circuitry 1502. Unary processing circuitry 1522 can produce a first set of output binary bits based on the operations on the input unary bit stream. Unary processing circuitry 1522 can include computational units 1520, multiplexer 1540 decoder 1550. Each of computational units 1520 may be configured to receive some or all of the unary bit stream generated by encoder 1510. Multiplexer 1540 can receive and select an output bit stream generated by one of computational units 1520. Decoder 1550 may convert the selected bit stream from unary, deterministic, or stochastic format to a binary number for the lower M bits of N-bit binary register 1570.

Binary processing circuitry 1562 may be configured to perform operations on a second subset of binary bits to produce a second set of output binary bits. The second subset of binary bits may be the remaining portion of a binary number after the first subset of binary bits has been fed to encoder 1520. There may or may not be overlap between the first and second subsets of the binary bits. Binary processing circuitry 1562 can include multiplexer 1560. Multiplexer 1560 may be configured to select an offset value (e.g., $b_i$) based on the upper N-M bits of the input binary number. In some examples, the positions of multiplexer 1540 and decoder 1550 may be switched, as shown in FIG. 17 (see decoders 1740 and multiplexer 1750).

Output circuitry 1572 is configured to produce a result based on the two sets of output binary bits. Output 1572 can include of N-bit binary register 1570 to receive the first set of output binary bits in the lower bits of register 1570. N-bit binary register 1570 can receive the second set of output binary bits in the upper bits of register 1570.

Each of computational units 1520 may include the components shown in FIG. 1 inside of computational unit 120. For example, one of computational units 1520 may include a scaling network with a fanout for the input bit stream that is generally proportional to the derivative of the transfer function of the computational operation. The computational unit can also include voting logic to enable implementation of transfer functions where at least a portion of the function has a negative slope. Although computational units 1520 are depicted as receiving only some of the bits generated by encoder 1510, each of computational units 1520 may be configured to receive all or some of the bits generated by encoder 1510, in some examples. In some examples, there may be more or fewer than four computational units 1520. Some of computational units 1520 may receive fewer than all of the bits generated in encoder 1510.

The hybrid binary-unary method can use a manageable encoding for reducing the length of a bit stream. The encoding divides a real number $X \in \{0,1\}$ into B-bit chunks as $$X = X_0 + \frac{X_1}{2^B} + \frac{X_2}{2^{2B}} + \cdots \frac{X_{k-1}}{2^{(k-1)B}}.$$

The number is essentially represented in base $2^B$ with k digits $X_i$. For example, when B=3 and k=2, the binary number $0.1010112$ can be rewritten as $0.(X_0 X_1)_8 = 0.53_8$ with $X_0=5$ and $X_1=3$. The digit 5 would be represented by a thermal encoding of five 1's out of 8 bits, and 3 would be 11100000.

An arbitrary function $Y=f(X)$ can be computed by breaking it up into sub-functions $Y_i=f_i(X_0, X_1, \ldots, X_{k-1})$, where $X=(0.X_1 X_2 \ldots X_{k-1})_2{}^B$ and $Y=(0.Y_1 Y_2 Y_{k-1})_2{}^B$. This approach can implement each of the $f_i$ functions using a single scaling network and alternator logic, even if the function is represented by a complex polynomial. Instead of using $2^W$ bits to represent numbers, this approach only use k bundles of bits, each of which is only $2^B$ bits wide. For example, by breaking up a 32-bit value into 4 digits of 8-bits each (B=8, k=4), only four sets of 256 bits are used as opposed to $2^{32}$ without the hybrid encoding. The sub-function approach can also increase or decrease the number of output wires and can fold in rounding into the function realization. For example, in evaluating $f(X_0)=0.8 X_0{}^2$, if $X_0$ is represented using 10 bits, then the output only needs to be 8 bits. When implementing the function using a scaling network, the lower bits (beyond the 8 bits) can be folded as a rounding method would do.

Further example details of logic devices for performing arithmetic operations on bit streams can be found in commonly assigned U.S. patent application Ser. No. 16/165,713, filed Oct. 19, 2018, and entitled "Parallel Computing Using Stochastic Circuits and Deterministic Shuffling Networks," which is incorporated herein by reference in its entirety.

Figure 16A:
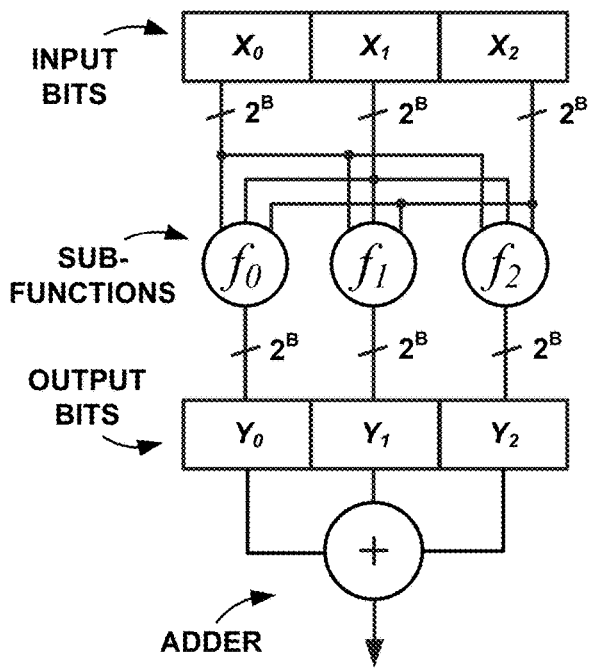
FIGS. 16A-16D show conceptual architectural options for the binary stochastic method.
Figure 16B:
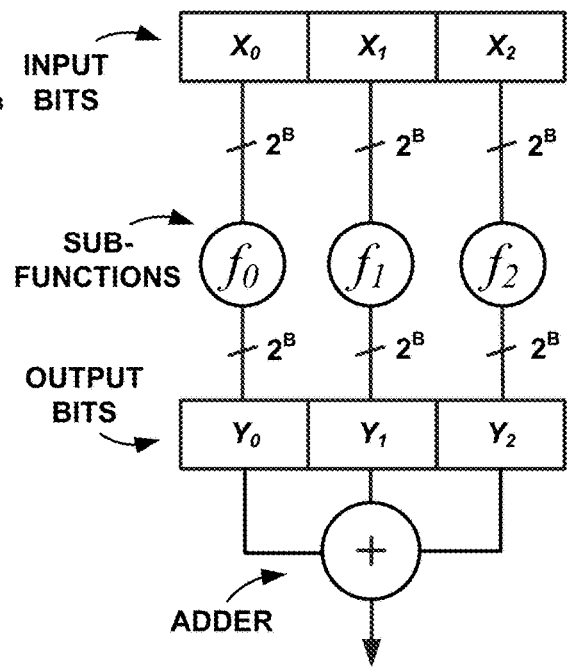
Figure 16C:
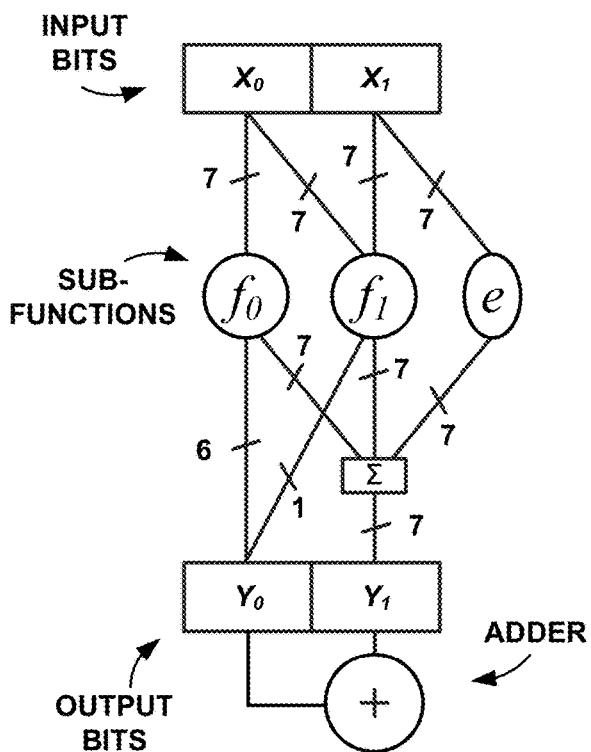
Figure 16D:
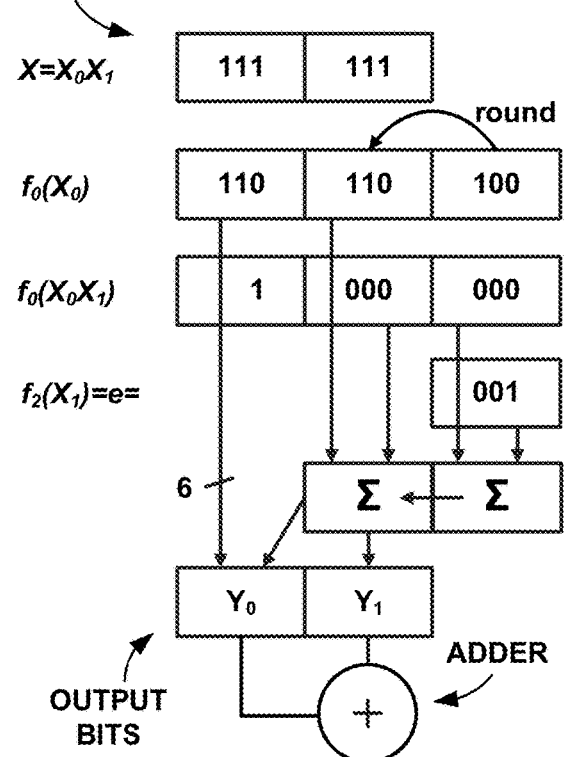

FIGS. 16A-16D show conceptual architectural options for the binary stochastic method. FIG. 16A shows a fully-connected architecture in which all sub-functions $f_i$ draw inputs from all $X_i$ digits. Such an architecture is not as efficient as FIGS. 16B-16D. FIG. 16B shows a circuit in which each base $2^B$ digit is treated independently, which is not realistic but it would be beneficial to reduce the number of inputs to simplify the functions. FIGS. 16C and 16D show a realization of the function $f(X)=0.8X+0.2X^2$ when two digits (k=2) are used with B=3, which is in base 8. Equation (17) shows the expansion of the function into two sub-functions $f_0$ and $f_1$, and the rounding error mitigation function e.

$$f\left(X_0 + \frac{1}{8}X_1\right) = f_0(X_0) + \frac{1}{8}f_1(X_0, X_1) + \frac{1}{8^2}e(X_1) = \qquad (17)$$

$$(0.8X_0 + 0.2X_0^2) + \frac{1}{8}(0.8X_1 + 0.4X_0 X_1) + \frac{1}{8^2}(0.2X_1^2)$$

Given that each digit corresponds to three binary digits, the maximum value for $X_0$ and $X_1$ would be $111_2=7$. In some examples, $X_0$ and $X_1$ can have different bit resolutions. Assuming these maximum values, FIG. 16D shows the maximum values that the sub-functions can output. To save space, FIG. 16D uses the binary representation in the boxes, but in the actual implementation, $110_2$ would be replaced by 111111. The function $f_i$ can generate a maximum value of 8 at the position corresponding to $X_1$, which means the function will generate a carry for the $X_0$ group. The carry can be generated by simply bundling together the six unary bits coming out of $f_0$ at position $X_0$, with one out of the sum units. The carry logic is similar to binary carry logic, but because the operations are being performed in base $2^B$, the carry chain would be exponentially smaller than a typical binary system (similar to high-radix multiplication). The function $f_0$ would not be evaluated in 3×7 bits: the rounding of the function can be folded into the implementation, so that the 14 bits of $f_0$ can be directly generated.

There are various optimization methods in terms of synthesizing the subfunctions and the adder logic. One option is to create another sub-function $f_{1,0}$ that directly decides on the bit to be bundled with the $Y_0$ group, and make $f_1$ output only 7 bits. Merging of the unary bundles can be done in binary (e.g., the adder unit in FIG. 16D could output binary instead of unary, making the output a binary number instead of unary. Furthermore, partitioning of the polynomial terms can be optimized. For example, the XOR gate has the polynomial $2x-2x^2$, which results in many intermediate digits to be negative. There are two techniques to tackle this problem: (1) find the best grouping of the digits so that positive and negative coefficients cancel each other out, and (2) use the bipolar representation that maps the [0,1] range to [−1,+1].

Each of the input bits shown in FIGS. 16A-16D can include some or all of the bits of an input unary bit stream. In some examples, there may be overlap between the bits in $X_0$ and $X_1$, such that a bit in $X_0$ is also included as bit of $X_1$. The sub-functions shown in FIGS. 16A-16D can operate on one or more sets of bits, as shown in FIGS. 16A-16D. Each of the sub-functions generates a set of output bits (e.g., $Y_0$, $Y_1$, and/or $Y_2$) for processing by the adder. The adder is an optional component of the circuits shown in FIGS. 16A-16D. In some examples, another computational unit or logic gate(s) may be configured to receive the output bits for a logic operation. The circuits shown in FIGS. 16A-16D can also output the $Y_0$, $Y_1$, and $Y_2$ directly without any processing.

The low area advantage of stochastic computing can come at an exponential price in latency or area, making the area×delay cost unattractive. A hybrid binary/unary representation to perform computations can potentially reduce the area of a stochastic computing circuit. A hybrid binary/unary device may first divide the input range into a few sub-regions selected by the higher bits of the input binary number, which corresponds to dividing the original function into a few sub-functions, then perform unary computations on each sub-region (sub-function) individually, and finally pack the outputs of all sub-regions back to compact binary. The result of breaking the original function into smaller sub-functions is that both the unary encoding and the unary function evaluation become exponentially less costly. A synthesis methodology and a regression model can be used to predict an optimal or sub-optimal design in the design space.

Hybrid binary/unary representation outperforms the binary and fully unary methods on a number of functions and on a common edge detection algorithm. In terms of area×delay cost, the cost of hybrid binary/unary representation is on average only 2.0%, 10.2%, and 48.8% of the binary for 8-, 10-, and 12-bit resolutions, respectively, which is 2-3 orders of magnitude better than the results of traditional stochastic methods. The hybrid binary/unary representation is not competitive with the binary method for high-resolution oscillating functions such as sin(15x) at 12-bit resolution.

In stochastic computing and unary computing methods, the generation of the bitstreams can be the major area and power cost. For example, the thermometer encoding unit generates the $2^N$ values for the parallel bitstreams, out of which the first M carry a value of '1', and the rest carry a value of '0' to represent $M=2^N$, hence the name "thermometer" encoding. The thermometer encoder can take up a majority of the area of the whole design, hence making it not competitive with binary designs when the number of inputs increases (which was the case in the median filtering implementation). The hybrid binary-unary computing approach can shorten the input region of the thermometer encoder to reduce the required bit-length of the encoder and, also, to simplify function implementations in the fully unary domain. The hybrid binary-unary computing splits the $[0 \ldots 2^N]$ input binary region into k regions with shorter bit-lengths. The regions would not necessarily have the same length. The corresponding sub-functions corresponding to each region are defined as shown in Equation (18).

$$f = g(x) = \begin{cases} g_1(x) & 0 < x \leq x_1 \\ \ldots \\ g_k(x) & x_{k-1} < x \leq x_k \end{cases} \quad (18)$$

In order to avoid the offsets $x_i$, each sub-function can be modified as shown in Equation (19) by shifting their input. Therefore, each subfunction can be implemented using the fully unary approach. The output of each subfunction, then, is multiplexed to produce g(x).

$$f = g(x) = \begin{cases} g_1(x) & 0 < x \leq x_1 \\ \ldots \\ g_k(x) & x_{k-1} < x \leq x_k \end{cases} \quad (19)$$

$$= \begin{cases} b_1 + h_1(x') & 0 < x' \leq x_1 \\ \ldots \\ b_k + h_k(x') & 0 < x' \leq x_k - x_{k-1} \end{cases}$$

Where $b_i$ (1≤i≤k) are the bias values added to simpler functions $h_i(x)$. Since each sub-function has narrower input and output ranges than g(x), therefore, each sub-function need smaller thermometer encoders at their input and smaller unary-to-binary decoders at their output, and the function $h_i(x)$ itself would be (exponentially) cheaper than g(x) to implement in terms of area cost and critical path delay. An example of the $g_i(x)$ functions is shown in FIG. 21, and functions $h_i(x)$ are shown in FIG. 20.

FIG. 17 illustrates a possible architecture for a hybrid binary-unary method. The overall architecture of FIG. 17 includes three stages or domains. In the first stage, N-bit binary register 1700 and the input of thermometer encoders 1710 handle numbers in the binary domain. An N-bit binary number stored in register 1700 can include a first portion (e.g., the lower M bits) and a second portion (e.g., the upper N-M bits). Thermometer encoder(s) 1710 may be configured to convert binary numbers from binary register 1700 to a unary bit stream with a left-flushed unary number format such that all the 1's appear first, followed by 0's. The input range is split into a few smaller regions, therefore the lower M bits of the input binary number value are fed to encoder(s) 1710.

Thermometer encoder 1710 is an example of encoders 210 and 310 shown in FIGS. 2 and 3, but operating on exponentially fewer bits (e.g., only the lower M bits). The device can include a plurality of unary cores 1730 (e.g., $2^{(N-M)}$ copies), each of which would be similar to computational unit 120 shown in FIG. 1. Encoders 1710 and decoders 1740 can be shared across different copies of unary cores 1730. Multiplexer 1750 selects the output of one of the core logics 1730, and multiplexer 1752 selects the binary bias number to be added to the selected sub-function to implement the original function. Multiplexers 1750 and 1752 may receive the second portion—for example (N-M) bits—of the binary number as control inputs. Multiplexers 1750 and 1752 may be configured to operate as a multi-level lookup table to combine the sub-functions and offset values into a single function covering the entire range of input values. The positions of decoders 1740 and multiplexer 1750 can be switched, as shown in the circuit of FIG. 15.

In the second stage, unary cores 1730 perform operations on unary bit streams in the unary domain. Unary cores 1730 may be configured to receive the unary bit stream generated by thermometer encoders 1710. In some examples, each of unary cores 1730 may include a computational unit with a scaling network and voting logic, as shown in FIG. 1. Each scaling network can have a fanout for the input bit stream that is generally proportional to the derivative of the transfer function or sub-function of the computational operation. The voting logic can implement the transfer function or sub-function where at least a portion of the function has a negative slope. In some examples, one of unary cores 1730 can receive fewer than all of the bits generated by encoders 1710. Each of unary cores 1730 can process a unary bit stream based on a sub-function to produce an output unary bit stream. Binary decoders 1740 can include adder trees 1742 for converting the output unary bit streams to binary numbers, as indicated in FIG. 17 by $Out_i$ through $Out_k$. Binary decoders 1740 are examples of decoders 260 and 360 shown in FIGS. 2 and 3, but decoding exponentially fewer bits.

In the third stage, binary decoders 1740 generate output binary numbers for selection by multiplexer 1750. Multiplexer 1750 may be configured to select one of the output binary numbers based on the upper N-M bits of the binary number from register 1700 (e.g., a second portion of the input binary number). Multiplexer 1752 may be configured to select an offset value (e.g., a bias value) based on the upper N-M bits of the binary number from register 1700.

Binary adder 1760 can perform bias addition by adding the outputs of multiplexers 1750 and 1752 to generate binary output 1770.

For example, register 1700 can store an eight-bit binary number that represents values from zero to 255. Thermometer encoder 1710 can receive and convert the lower six bits (e.g., the six least significant bits) of the binary number to a 64-bit unary bit stream. Each of unary cores 1730 can operate on the unary bit stream, or a shuffled version of the unary bit stream, to generate output unary bit streams, which may have a resolution of 64 bits. In some examples, each of unary cores 1730 processes bit streams based on a unique sub-function. Thus, the output unary bit stream generated by each of unary cores 1730 may represent the result of a different computational operation, such as a linear operation, a polynomial operation, an exponential operation, and/or any other computational operation.

Decoders 1740 may be configured to generate four six-bit output binary numbers based on the output unary bit streams received from unary cores 1730. In examples in which all of unary cores 1730 have the same output resolution, the adder tree 1742 can be shared and placed after Multiplexer 1750. Multiplexer 1750 receives all of the binary numbers from decoders 1740 and can select one of the binary numbers for output. Multiplexers 1750 and 1752 may receive the upper two bits of the binary number and select one of four input values. For example, in examples in which both of the upper two bits are zeroes, multiplexers 1750 and 1752 may be configured to output the respective first input value (e.g., Out$_1$ and b$_1$ shown in FIG. 17).

The h$_i$(x) functions of unary cores 1730 may have the same input range, enabling them to share thermometer encoders 1710, which will translate to a lower overall implementation cost. The second stage contains the set of unary cores 1730 (e.g., "unary computation cores") that implement sub-functions h$_i$(x). The third stage of the architecture uses adder trees 1742 to convert individual h$_i$(x) function outputs to binary numbers. Multiplexer 1750 then multiplexes the sub-function outputs based on the upper bits of the original binary input received from register 1700. An appropriate bias value (b$_i$) is added to the corresponding binary sub-function output to produce the final output. The architecture of FIG. 17 can reduce the cost of thermometer encoder 1710 and unary cores 1730 when implementing polynomial and nonpolynomial functions.

The unary bit streams described herein, such as the bit streams received by unary cores 1730 or the bit streams received by decoders 1740, may not be unary or deterministic in nature but may be stochastic in nature (e.g., random or pseudorandom). The bit streams need not be unary or deterministic in nature for unary cores 1730 to perform computational operations. Instead, the bit streams may be stochastic in nature. Although referred to herein as "unary logic circuitry" or "unary cores," the logic circuitry may be configured to operate on any of the following bit streams: unary bit streams, edge coded bit streams (e.g., one-hot or one-cold encoding), deterministic bit streams, stochastic bit streams, pseudorandom bit streams, and/or any other type of bit streams. Use of the term "unary cores" is meant to suggest only that the logic circuitry may be similar to circuitry configured to operate on unary bit streams.

For example, a unary bit stream can include a deterministic bit stream that deterministically encodes a numerical value based on a proportion of data bits in the deterministic bit stream that are high relative to data bits in the deterministic bit stream that are low. Alternatively, the unary bit stream can include a stochastic bit stream that encodes a numerical value based on a probability that a data bit in the stochastic bit stream is high. Unary cores 1730 can operate on the deterministic bit stream and/or the stochastic bit stream.

A unary bit stream may include an edge-coded bit stream (e.g., a one-hot bit stream). An edge-coded bit stream is an alternative to thermometer coding in which the bit stream indicates the transition from ones to zeroes or vice versa. An edge-coded bit stream can have a single one bit to indicate the value represented by the bit stream. In the example of the one-cold bit stream, a single zero bit can encode the value represented by the bit stream. In examples in which a thermometer code for a unary bit stream is 00001111, an equivalent one-hot bit stream is 00010000, and an equivalent one-cold bit stream is 11101111. Thermometer encoders 1710 and/or unary cores 1730 may be configured to generate an edge-coded bit stream. Unary cores 1730 and/or decoders 1740 may determine the transition bit in the edge-coded bit stream and use the transition bit to operate on the edge-coded bit stream. Using edge coding in addition to, or as an alternative to, thermometer coding may provide resource savings when implementing multivariate functions.

To implement the hybrid binary-unary architecture, there is a choice between the architectures of FIGS. 16A-16D and a choice of how wide each bit group should be. FIG. 17 shows a naïve hybrid binary-unary method where the N-bit binary input value is divided into a lower M-bit segment, and an upper [N-M]-bit segment. The function is broken into $2^{N-M}$ sub-functions, where each function can use one of computational units 120 shown in FIG. 1.

Figure 18:
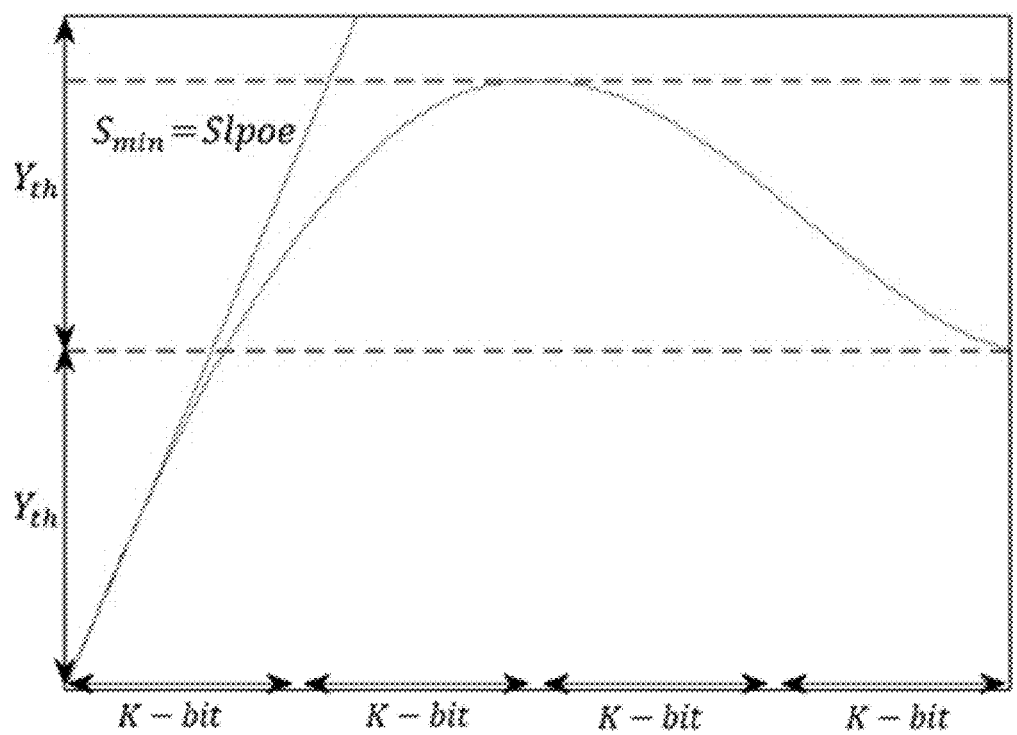
FIG. 18 is a graph illustrating a function breaking methodology.

FIG. 18 is a graph illustrating a function breaking methodology. There are a number of parameters to guide the process of breaking a function into smaller sub-functions. Three of the most effective parameters are shown in FIG. 18. First, $Y_{threshold}$, which represents the maximum allowable output range of the (sub-)function in each region. Second, $L_{min}$, which represents the minimum possible range of each region. Third, $S_{max}$, which represents the maximum allowable slope of the function in each region.

The hybrid binary-unary computing approach can decompose a function from an N-bit binary fixed-point version of the function in the following steps. First, divide the N-bit input range into k-bit distinct ranges. Second, divide the length of each region by two if the output domain of that region violates the $Y_{threshold}$ criteria. This reduction can be repeated for each new region until the output range of that region passes the $Y_{threshold}$ criteria or the input range of the function gets as small as $L_{min}$. Third, divide the length of each region by two if the slope of the function in that region violates the $S_{max}$ criteria. This reduction can be repeated for each new region until the output and the input domains of that region pass $S_{max}$ and $L_{min}$ criterion, respectively. Fourth, find h$_i$(x)s and their corresponding bias values. Fifth, generate HDL code to implement g(x) using h$_i$(x)s and required encoder(s) and decoder(s). If the final set of functions h$_i$(x)s have different x ranges, then the selection method can use overlapping upper and lower bits of the original input (e.g., for an 8-bit input, three upper bits can be used as control circuitry of multiplexers 1750 and 1752, and the 6 lower bits can be used as input to the thermometer encoder 1710).

The synthesizer reports upper bounds of subfunction's input and output ranges which are used to generate the HDL code. The upper bound of inputs determines the required bit-length of encoders and the upper bound of outputs determines the required bit-length of the decoders. Moreover, the synthesizer reports the number of required logic gates to implement sub-functions. The proposed synthesizer tries to find the optimal or sub-optimal design without affecting the output quality.

Figure 19:
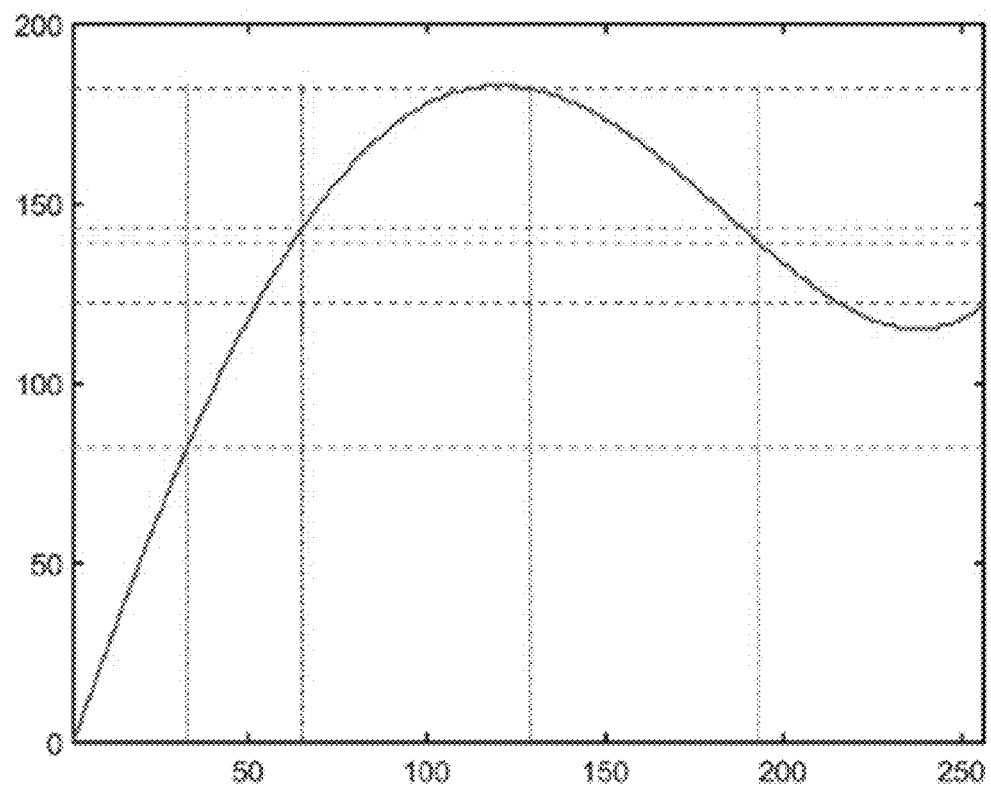
FIG. 19 is a graph illustrating synthesized results of an arbitrary function methodology

FIG. 19 is a graph illustrating synthesized results of an arbitrary function methodology. FIG. 20 is a graph illustrating smaller sub-functions without bias. FIG. 21 is a graph illustrating smaller sub-functions with bias. FIGS. 19-21 show the results of the synthesis process for an arbitrary function. In the example of FIGS. 19-21, the following values can be set: k=6, $Y_{threshold}$=26, $L_{min}$=23, and $S_{max}$=3. FIG. 19 shows all input regions and corresponding output regions. The synthesis approach divides the input region into different small regions and then considers g(x) corresponding to each region as an individual sub-function. For example, there may be two 5-bit (e.g., 32 distinct x values) regions and four 6-bit regions. Thus, for the example shown in FIGS. 19-21, a hybrid binary-unary architecture can include 5-bit and 6-bit thermometer encoders and then share the 5- and 6-bit encoders between required sub-functions. In examples in which at least 5 lower bits of the input are used for unary computation, the multiplexers can use the three upper bits as control inputs at the third stage in the hybrid binary-unary architecture.

FIG. 20 shows all sub-functions $h_i(x)$. The proposed approach has converted a complex non-monotonic function into a few small monotonic functions and just one simple and small non-monotonic function. Because g(x) in FIG. 21 is nonmonotonic in regions 2-5, a unary approach could use many logic gates with multiple inputs. In contrast, a hybrid binary-unary method can break the function into mostly monotonic sub-functions, eliminating the majority of the logic gates and their input size, resulting in unary implementations that require much less hardware resources.

FIG. 21 shows all $h_i(x)$'s corresponding bias values. These bias values are used to produce the final result. Since the hybrid binary-unary computing approach uses shared and smaller encoders as well as implements sub-functions using simple routing networks (or lower logic gate cost), the hybrid binary-unary architecture can implement any complicated function more efficiently compared to previous approaches.

FIG. 21 shows an example of a function broken into smaller sub-functions. Only the "curved" part of each sub-function needs to be implemented using only the lower M bits of the original binary input, and a bias value or offset value can be added to the final result. The unary architecture can encode/decode M-bit numbers, which results in exponentially lower costs compared to the full N-bit version. The number of unary wires does not change compared to the original flat architecture because there are $2^{N-M} \times 2^M = 2^N$ wires, but since the sub-functions are potentially simpler (more likely to be monotonic), the number of gates is reduced dramatically.

The results of this architecture are quite promising. A×D numbers are on average only 0.2% of the A×D cost of the conventional binary method. These numbers include encoder and decoder units. These numbers are an order of magnitude better than the "flat" architecture shown in FIG. 1. The A×D cost savings over binary are 99.92%, 99.72% and 92.59% for 8-, 10- and 12-bit resolutions respectively.

Even for functions that are more difficult to implement using the hybrid binary-unary method, there are improvements over conventional binary at 8- and 10-bit resolutions. For example, the function [1+sin(15x)]/2 has an A×D value for the hybrid binary-unary method that is 1.41× worse than conventional binary at 12 bits of resolution. This ratio reduces to 0.0271× at 10 bits of resolution, i.e., it beats conventional method at that resolution. The hybrid binary-unary method cannot always beat conventional binary (e.g., at 12 bits in the example above). In practical applications such as image processing, filtering, encryption, and machine learning that do not have such "complex" functions, the hybrid binary-unary method can be useful.

Figure 22:
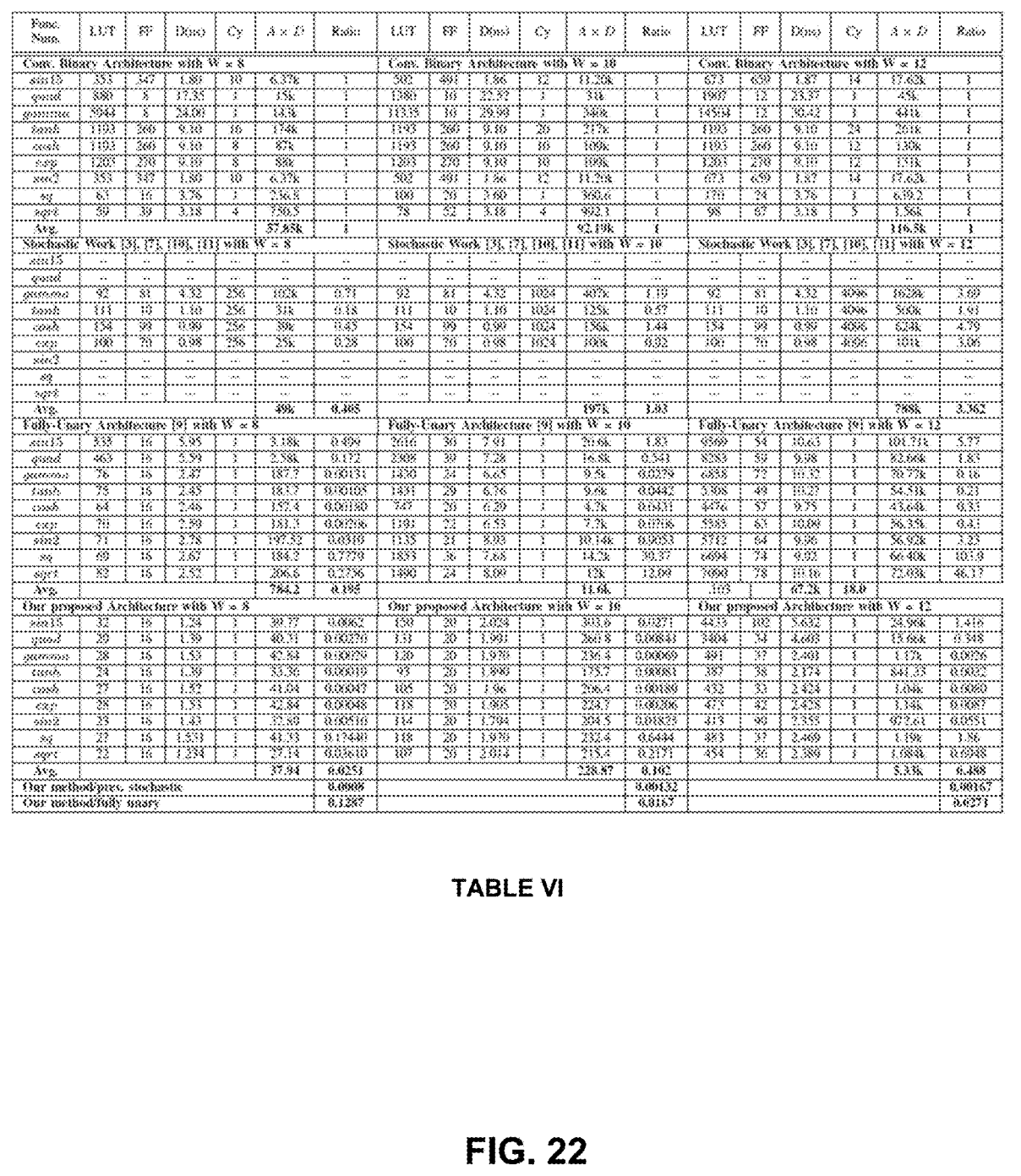

All designs were implemented in Verilog and compiled on Kintex7XC7K70TFBG676-2 FPGAs using the Xilinx Vivado 2016:4 default design flow. Table V shows a number of sample functions that were used to compare different methods. Table VI shown in FIG. 22 shows four methods to implement all functions: the conventional binary, serial stochastic, fully unary method, and the hybrid binary-unary method (e.g., FIG. 17) with 8-, 10-, and 12-bit resolutions. Table VI shown in FIG. 22 compares these methods in terms of area×delay.

TABLE V

| Implemented functions | |
|---|---|
| Function name | Function |
| sin15 | $\frac{1 + \sin(2x)}{2}$ |
| quad | $30x(1 - x)(x - 0.4)^2$ |
| gamma | $x^{0.45}$ |
| tanh | $\frac{1 + \sin(15x)}{2}$ |
| cosh | $\cosh(x) - 1$ |
| exp | $e^{x-1}$ |
| sin2 | $\frac{1 + \tanh(4(2x - 1))}{2}$ |
| sq | $x^2$ |
| sqrt | $\sqrt{x}$ |

FIG. 22 is Table VI illustrating area and delay results using field-programmable gate arrays. Table VI shown in FIG. 22 shows the area×delay results, and is divided into four groups for each resolution. Columns 2-4 show the number of LUTs and FFs used to implement the function, and the critical path delay. Column 5 labeled "Cy" shows the number of clock cycles needed to calculate the function. The A×D column shows the area×delay product, which is the multiplication of the LUT, Delay, and Cy columns. Finally, the "Ratio" column shows the ratio of the stochastic, fully unary method and the architecture shown in FIG. 17 compared to the conventional binary. For stochastic implementation, the area cost includes conversions from and to the binary format. The architecture of FIG. 17 was used for the hybrid binary-unary architecture, including thermometer encoder(s) 1710 and decoder(s) 1740. Therefore, the reported cost includes converting from and to the binary format and unary cores.

TABLE VII

| Synthesis parameters. | | | |
|---|---|---|---|
| N | 8, 10, 12 | $L_{min}$ | 2, 4, 8, 16, 32 |
| k | 4: N − 1 | $S_{max}$ | 2: 6 |
| $Y_{threshold}$ | 2: N − 1 | | |

When the resolution increases, the stochastic method starts to perform increasingly worse compared to binary, which is expected given the exponential number of cycles for bitstream representation. The fully-unary method suffers from the cost of the thermometer encoder and an exponential increase in the size of the scaling network and the alternating logic, which gets more pronounced as the resolution increases. The fully unary method can outperform the conventional binary implementation for non-oscillating functions with 8-bit precision. For 10- and 12-bit resolutions the fully unary cannot be competitive with conventional binary implementations even for some of the non-oscillating functions. On the other hand, the hybrid binary-unary method outperforms conventional binary implementations for 8- and 10-bit resolution for all functions, in some cases by orders of magnitude. On average, the hybrid binary-unary method takes only 2.51% and 10.2% of the A×D of the conventional binary, 0.08% and 0.13% of previous stochastic, and 12.87% and 1.67% of fully unary approaches for 8- and 10-bit resolutions, respectively. For 12-bit precision, the hybrid binary-unary method performs worse than the conventional binary method for one oscillating function and square function, but performs quite well for others.

Based on synthesis parameters bit length N, k, $Y_{threshold}$, $L_{min}$, and $S_{max}$, the proposed synthesis method provides different hardware design options. It may not be practical to perform an exhaustive search of the design space to find the best hardware implementation for higher bit resolutions. Instead, a model can be used to find near-optimal (or optimal) solutions based on certain parameters that estimate the cost of the HDL synthesized circuit. The arithmetic mean and variance of the upper bound of sub-functions' input and output ranges as well as the number of logic gates are important factors in estimating the HDL design cost.

A linear regression model can be developed to estimate the HDL implementation cost. The first five and the eighth functions of Table V can be used to "train" the regression model and test the effectiveness of the regression model on the rest of the functions. To derive the regression parameters, all possible designs were implemented for the training set, using the parameters and ranges shown in Table VII. The proposed area cost model is shown in Equation (20), where $b_i$ and $z_i$ are shown in Table VIII.

$$LUT\_cost = \Sigma_{i=0}^{12} b_i \times z_i \quad (20)$$

TABLE VIII

Model parameters.

| $b_i$ | | $z_i$ | |
|---|---|---|---|
| $b_0$ | −28760.3746 | $z_0$ | 1 |
| $b_1$ | 3280.417077 | $z_1$ | N |
| $b_2$ | −521.1131285 | $z_2$ | k |
| $b_3$ | 3.45158634 | $z_3$ | $Y_{threshold}$ |
| $b_4$ | 55.96917283 | $z_4$ | $L_{min}$ |
| $b_5$ | −150.211725 | $z_5$ | $S_{max}$ |
| $b_6$ | 15.08260571 | $z_6$ | $OutDim_{Max}$* |
| $b_7$ | 6.473008135 | $z_7$ | $InDim_{Max}$* |
| $b_8$ | 17.82968283 | $z_8$ | $AM_{UboundIn}$* |
| $b_9$ | −11.08795092 | $z_9$ | $AM_{UboundOut}$* |
| $b_{10}$ | 15.13624618 | $z_{10}$ | $V\,AR_{UboundIn}$* |
| $b_{11}$ | −18.28720036 | $z_{11}$ | $V\,AR_{UboundOut}$* |
| $b_{12}$ | 5.669041242 | $z_{12}$ | #XOR gates |

In Table VIII, $OutDim_{Max}$ is the maximum upper bound of sub-functions' output ranges. $InDim_{Max}$ is the maximum upper bound of sub-functions' input ranges. $AM_{UboundIn}$ is the arithmetic mean of upper bound of sub-function input ranges. $AM_{Uboundout}$ is the arithmetic mean of upper bound of sub-function output ranges. $V\,AR_{UboundIn}$ is the variance of upper bound of sub-functions' input ranges. $V\,AR_{UboundOut}$ is the variance of upper bound of sub-function output ranges.

TABLE IX

Regression statistics.

| MultipleR | 0.93825 |
|---|---|
| RSquare | 0.88033 |
| AdjustedRSquare | 0.88025 |
| StandardError | 5829.79 |

The regression statistics are presented in Table IX. The R-Square parameter is 0.88, which means there is a relatively linear relationship between inputs and output values of the proposed model, and that 88% of the variations in the training samples can be explained by the proposed model.

Figure 23:
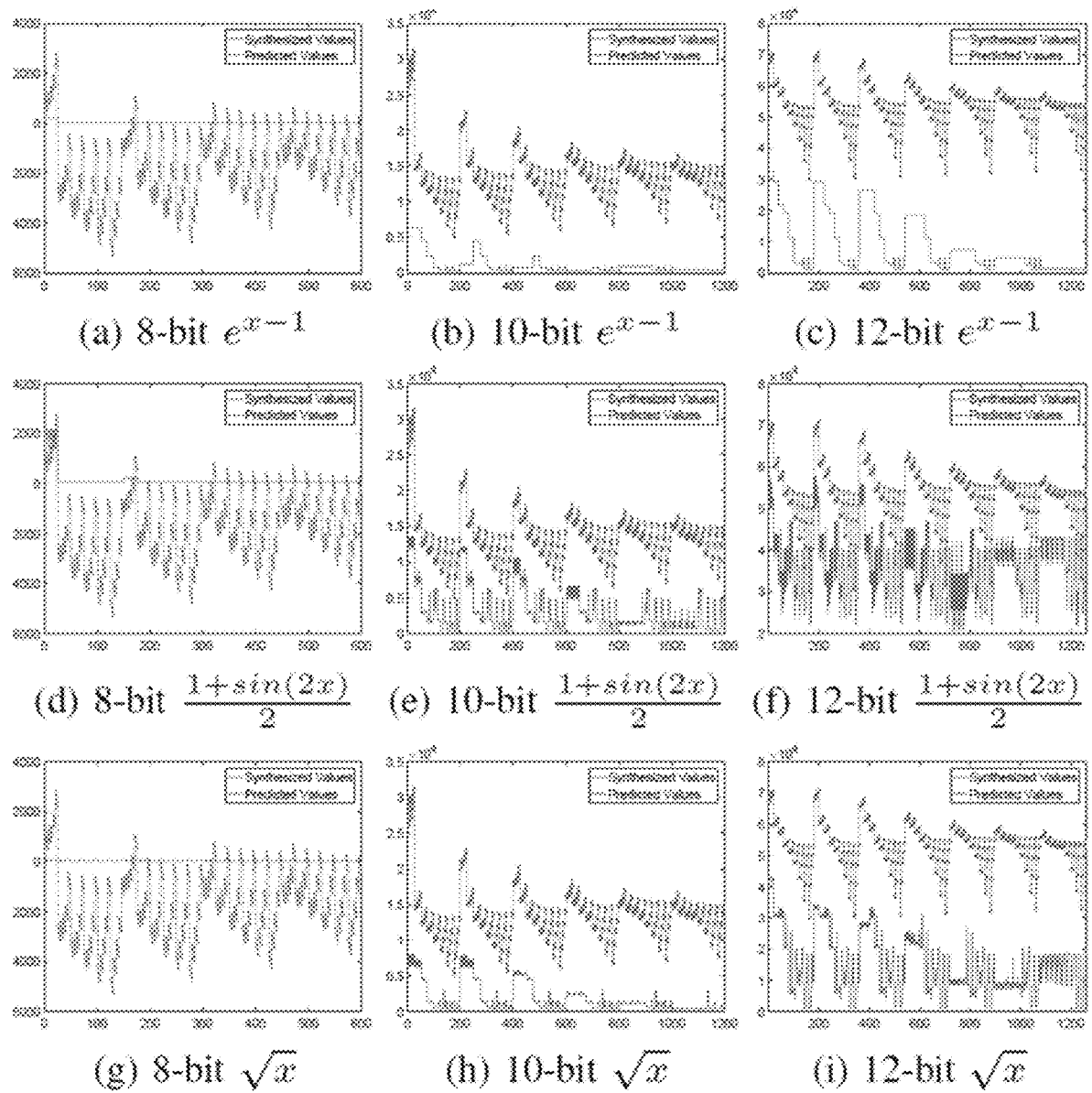
FIG. 23 is a set of graphs of validation test results for exponential and sin 12× for 8-, 10-, and 12-bit resolutions.

FIG. 23 is a set of graphs of validation test results for exponential and sin 12x for 8-, 10-, and 12-bit resolutions. FIG. 23 shows the validation test results of the sixth, seventh, and ninth functions of Table V (test functions). The x-axes show different designs chosen by randomly assigning values to design parameters (600-1200 different designs). The y-axes show the cost. The curves show predicted costs, and the curves also show the exact synthesis cost. FIG. 23 shows that, although the model cannot predict the exact cost, the model can pick the design or configuration parameters that result in an optimal or sub-optimal solution in a majority of cases. In other words, in most cases when the estimator model says a design is best among the 600-1200 implementation options, the real cost of that particular design is also the minimum among all the implementations.

Figure 24:
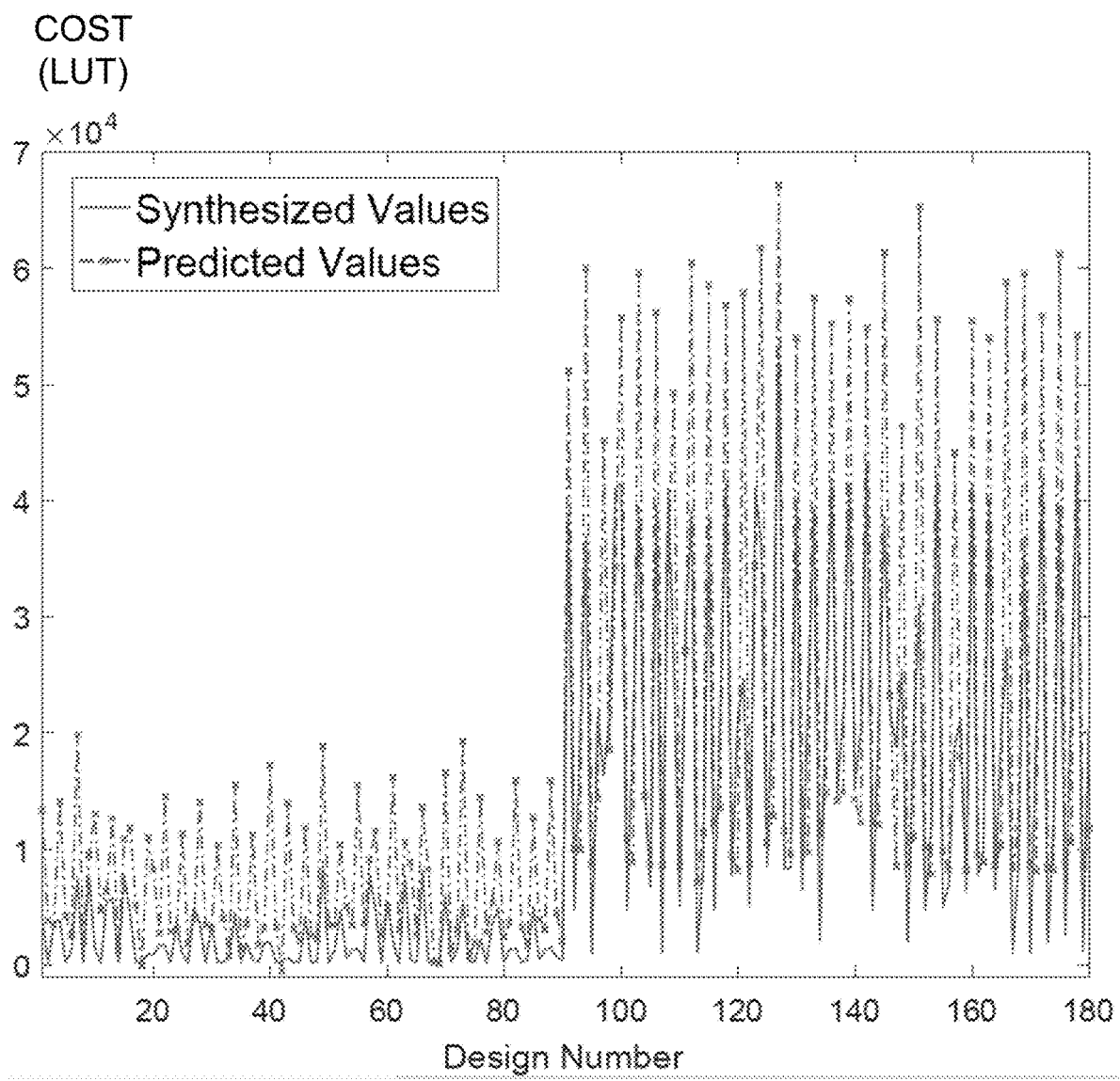
FIG. 24 is a graph of fidelity test results.

FIG. 24 is a graph of fidelity test results. FIG. 24 compares the real cost of synthesized circuits with the predicted cost of few designs, which have been selected randomly from 8-, 10-, 12-bit resolution design space of all functions of Table V. As can be seen, the predicted cost follows the synthesized cost well. Therefore, the proposed model can provide configuration parameters that lead to an optimal or near-optimal solution.

To test the feasibility of such models, a heuristic synthesis methodology for the naïve hybrid binary-unary architecture was developed, as shown in FIGS. 15 and 17. The heuristic uses parameters such as input bit length, number of sub-functions, maximum allowable range of output for each sub-function, maximum slope of a sub-function, and the minimum number of bits M in FIGS. 15 and 17. The best architecture for a subset of function was developed using an exhaustive search of the parameters, spending long hours synthesizing each option. A simple linear regression model was developed based on the design parameters to estimate the area cost of the design. The model can predict the cost of a large number of random designs, 180 in total. Each of these 180 designs were functions similar to the ones in Table IV, plus functions such as sin(15x), square root, etc. with random resolutions from the set {8, 10, 12}. These 180 designs were also synthesized using an exhaustive search method, and the actual and predicted costs were compared. FIG. 24 shows the results of this experiment. There is very good fidelity between the predicted model and the actual cost, even though the predicted value of the cost is not accurate.

Figure 25:
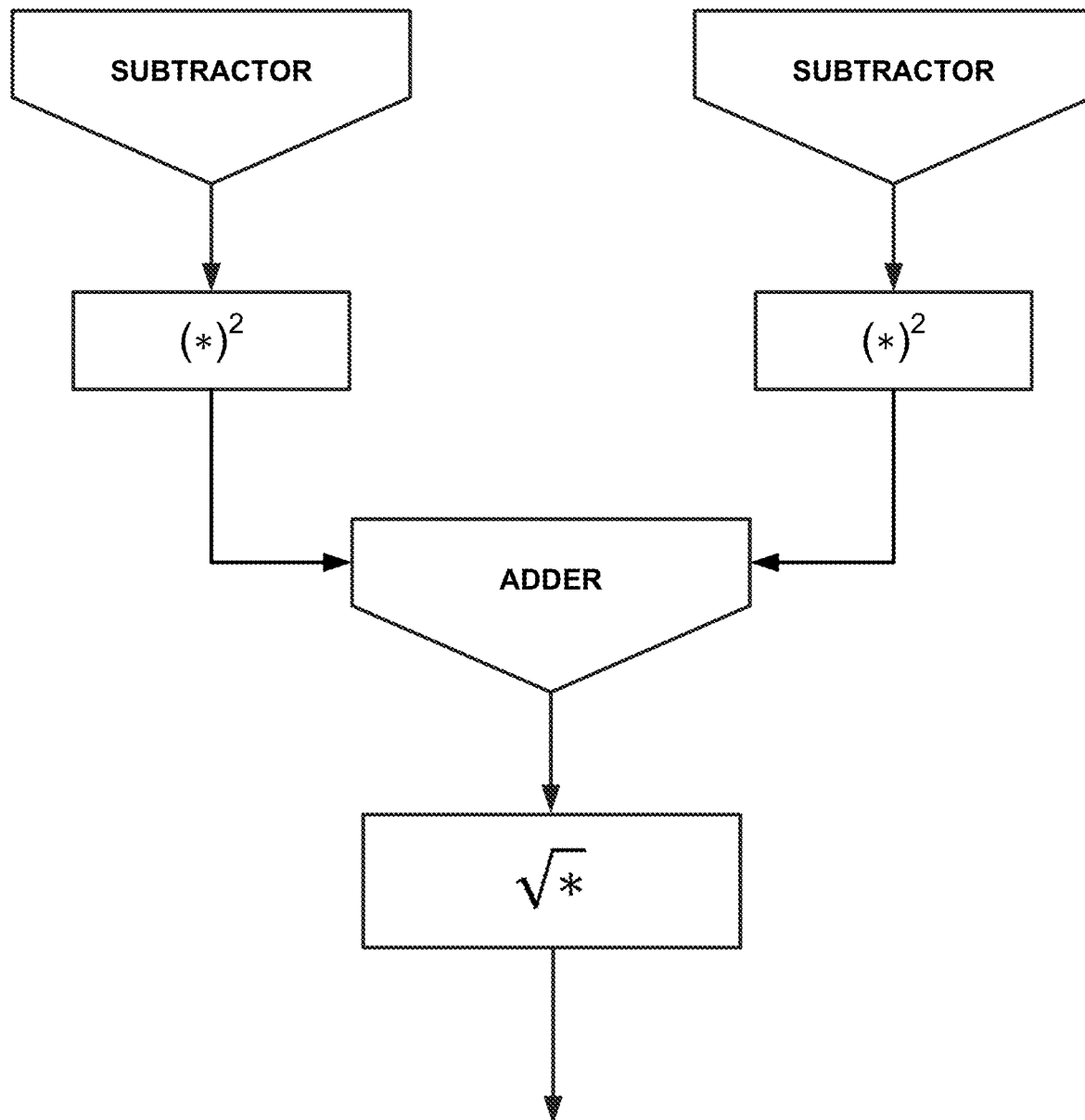
FIG. 25 is a conceptual block diagram of a Robert cross edge detection architecture.

FIG. 25 is a conceptual block diagram of a Robert cross edge detection architecture. The hybrid binary-unary method can be evaluated using the Robert cross edge detection algorithm shown in FIG. 25 at 8-bit resolution. In the conventional binary implementation, a CORDIC unit can evaluate the square root function. The fully unary and hybrid binary-unary versions of the square and square root functions can be used to evaluate these methods. Table X shows the hardware implementation results. The hybrid binary-unary method has 7% and 37.6% the cost of the binary and the fully-unary implementations, respectively.

TABLE X

Robert cross hardware results.

| Method | LUT | FF | D(ns) | Cy | A × D | Ratio |
|---|---|---|---|---|---|---|
| Conventional Binary | 243 | 40 | 14.812 | 1 | 3.6k | 1 |
| Fully Unary | 252 | 80 | 2.67 | 1 | 672 | 0.186 |
| Hybrid Binary - Unary | 107 | 80 | 2.37 | 1 | 253 | 0.070 |

Figure 26B:
FIGS. 26A and 26B shows an original image and an output of a hybrid binary-unary architecture.
Figure 26A:

FIGS. 26A and 26B shows an original image and an output of a hybrid binary-unary architecture. The error of the hardware output is 0.0% compared to the MATLAB simulation.

The hybrid binary-unary computing approach to implement complex functions may have lower cost than the fully unary, the stochastic computing, and conventional binary approaches. The hybrid binary-unary architecture takes advantage of the compact representation of the binary method and simple implantation of the fully unary method to design a hybrid architecture. A synthesizer can create a design space as well as a model to predict an optimal or sub-optimal design. The hybrid binary-unary method solidly outperforms other methods at 8- and 10-bit resolutions. Moreover, the hybrid binary-unary method was competitive with the conventional binary and fully unary method on an edge detection algorithm.

Figure 27:
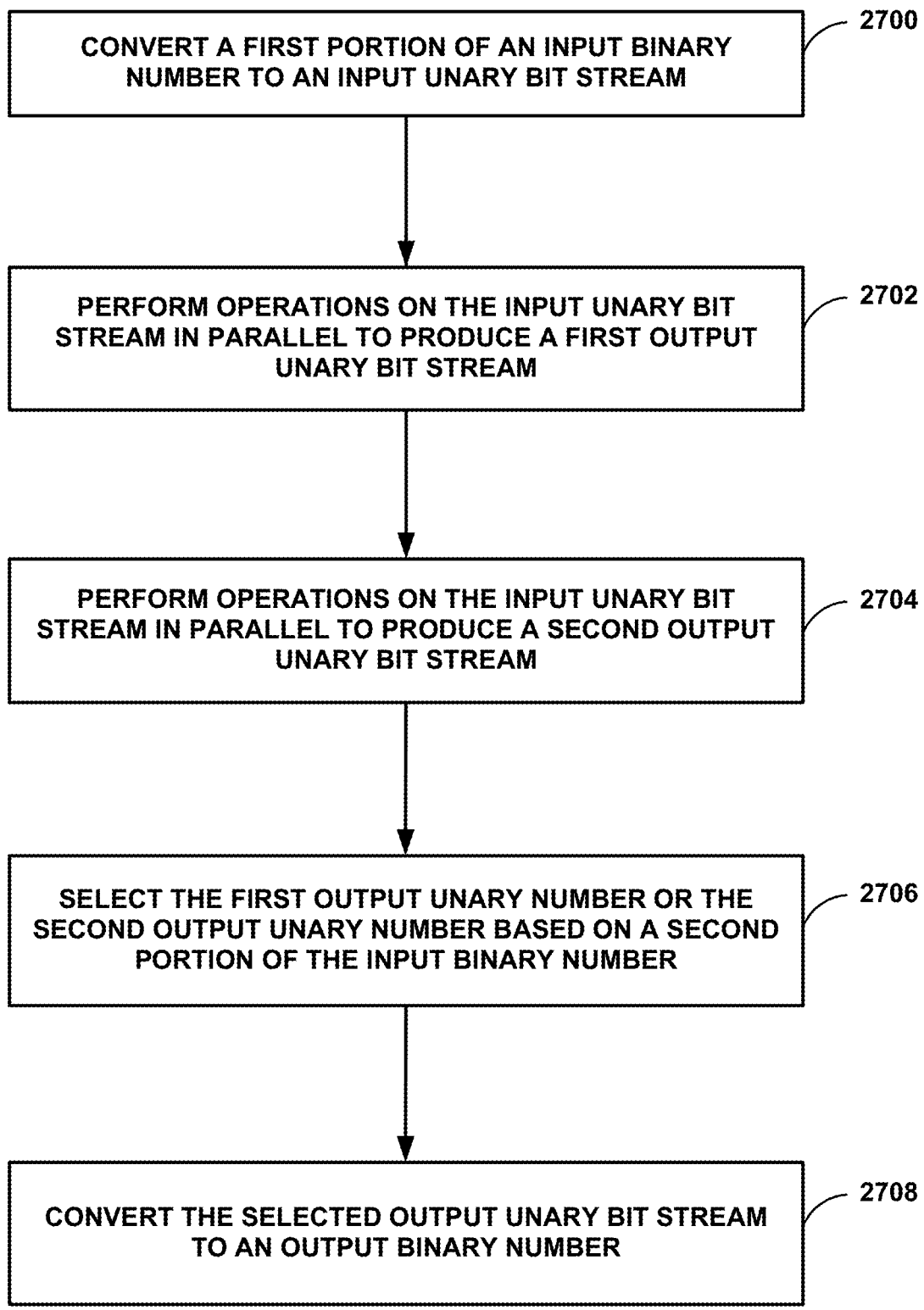
FIG. 27 is a flowchart illustrating example techniques for performing operations on binary numbers using a hybrid binary-unary method, in some examples of this disclosure.

FIG. 27 is a flowchart illustrating example techniques for performing operations on binary numbers using a hybrid binary-unary method, in some examples of this disclosure. The techniques of FIG. 27 are described with reference to the circuitry of FIG. 15, although other components may perform similar techniques.

In the example of FIG. 27, encoder 1510 converts a first portion of an input binary number to an input unary bit stream (2700). Encoder 1510 can receive the lower M bits of the N-bit binary number stored in register 1500. The area of encoder 1510 can be substantially less for converting M bits, as compared to an encoder for converting N bits. The lower M bits may be any number of bits, including one, two, three, or more bits.

In the example of FIG. 27, computational units 1520 perform operations on the input unary bit stream to produce at least two output unary bit streams (2706). The operations can include computational operations, such as multiplication, addition, and scaled addition. Computational units 1520 may include logic gates, stochastic logic circuitry, lookup tables, and/or any other computational circuitry.

In the example of FIG. 27, multiplexer 1540 selects the first or second output unary bit stream based on a second portion of the input binary number (2708). Multiplexer 1540 can receive the upper N-M bits of the binary number stored in register 1500 and use the upper N-M bits as the control input for multiplexer 1540. In examples in which N-M equals two bits, multiplexer 1540 can select from four inputs. The upper M bits may be any number of bits, including one, two, three, or more bits. The four inputs to multiplexer 1540 may represent four sub-functions, which can be combined to approximate a function, as shown in FIGS. 18-21. FIGS. 20 and 21 show an example with five sub-functions, where each of the first two sub-functions have an input range of 32, and each of the next three sub-functions have an input range of 64.

In the example of FIG. 27, decoder 1550 converts the selected output unary bit stream to an output binary number (2706, 2708). The output binary numbers can have the same resolution as the input to encoder 1510 (e.g., M bits).

This disclosure contemplates computer-readable storage media comprising instructions to cause a processor to perform any of the functions and techniques described herein. The computer-readable storage media may take the example form of any volatile, non-volatile, magnetic, optical, or electrical media, such as random-access memory (RAM), read-only memory (ROM), nonvolatile RAM (NVRAM), electrically erasable programmable ROM (EEPROM), or flash memory. The computer-readable storage media may be referred to as non-transitory. A computing device may also contain a more portable removable memory type to enable easy data transfer or offline data analysis.

The techniques described in this disclosure, including those attributed to device 100 and the devices shown in FIGS. 2, 3, 15, and 17, and various constituent components, may be implemented, at least in part, in hardware, software, firmware or any combination thereof. For example, various aspects of the techniques may be implemented within one or more processors, including one or more microprocessors, digital signal processors (DSPs), application-specific integrated circuits (ASICs), FPGAs, or any other equivalent integrated or discrete logic circuitry, as well as any combinations of such components, embodied in programmers, remote servers, or other devices. The term "processor" or "processing circuitry" may generally refer to any of the foregoing logic circuitry, alone or in combination with other logic circuitry, or any other equivalent circuitry.

Such hardware, software, firmware may be implemented within the same device or within separate devices to support the various operations and functions described in this disclosure. For example, any of the techniques or processes described herein may be performed within one device or at least partially distributed amongst two or more devices, such as between the components of device 100 and the devices shown in FIGS. 2, 3, 15, and 17. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in an article of manufacture including a non-transitory computer-readable storage medium encoded with instructions. Instructions embedded or encoded in an article of manufacture including a non-transitory computer-readable storage medium encoded, may cause one or more programmable processors, or other processors, to implement one or more of the techniques described herein, such as when instructions included or encoded in the non-transitory computer-readable storage medium are executed by the one or more processors. Example non-transitory computer-readable storage media may include RAM, ROM, PROM, EPROM, EEPROM, flash memory, a hard disk, a compact disc ROM (CD-ROM), a floppy disk, a cassette, magnetic media, optical media, or any other computer readable storage devices or tangible computer readable media.

In some examples, a computer-readable storage medium comprises non-transitory medium. The term "non-transitory" may indicate that the storage medium is not embodied in a carrier wave or a propagated signal. In certain examples, a non-transitory storage medium may store data that can, over time, change (e.g., in RAM or cache). Elements of device 100 and the devices shown in FIGS. 2, 3, 15, and 17 may be programmed with various forms of software. The one or more processors may be implemented at least in part as, or include, one or more executable applications, application modules, libraries, classes, methods, objects, routines, subroutines, firmware, and/or embedded code, for example.

Various embodiments of the invention have been described. These and other embodiments are within the scope of the following claims.

The invention claimed is:

1. A device configured to perform a digital computational operation, the device comprising:
    a register configured to store an input binary-encoded number, wherein the input binary-encoded number includes fewer than N bits;
    a thermometer encoder configured to convert the input binary-encoded number to an N-bit encoded input value, wherein the N-bit encoded input value includes a thermometer unary encoded input value or an edge encoded input value;
    a plurality of N input wires and a plurality of N output wires, each input wire of the plurality of N input wires configured to receive a respective input bit of the N-bit encoded input value, and each output wire of the plurality of N output wires configured to output a respective output bit of an N-bit encoded output value having the same number of bits as the encoded input value, wherein the N-bit encoded output value includes a thermometer unary encoded output value or an edge encoded output value; and
    scaling network circuitry configured to apply a function to the N-bit encoded input value to produce the N-bit encoded output value that is different from the N-bit encoded input value by simultaneously electrically routing at least one input wire of the plurality of N input wires to at least two output wires of the plurality of N output wires.

2. The device of claim 1, further comprising voting circuitry configured to receive, from the scaling network, at least two input wires electrically routed by the scaling network for a single corresponding one of the output bits of the N-bit encoded output value,
    wherein the voting circuitry includes a logic gate configured to output the one of the output bits of the N-bit encoded output value based on the bits of the N-bit encoded input value carried by the at least two input wires electrically routed by the scaling network circuitry to the voting circuitry.

3. The device of claim 2, wherein the logic gate comprises an XOR gate configured to receive the at least two input wires electrically routed by the scaling network to the single output wires and output a logically true value for the respective output bit of the N-bit encoded output value only when an odd number of input wires of the at least two input wires carries a logically true value.

4. The device of claim 2, wherein the function applied by the scaling network circuitry comprises a monotonically decreasing function, an oscillating function having at least one minimum, or a function having at least one portion with a negative slope.

5. The device of claim 1,
    wherein the scaling network circuitry comprises at least one direct wiring connection between one input wire of the plurality of N input wires for one of the bits of the N-bit encoded input value and one output wire of the plurality of N output wires for one of the bits of the N-bit encoded output value, and
    wherein the N-bit encoded input value and the N-bit encoded output value are encoded with the same number of bits.

6. The device of claim 1,
    wherein the function applied by the scaling network circuitry comprises a monotonically increasing function, and
    wherein each output wire of the plurality of N output wires for the bits of the N-bit encoded output value is directly wired to one input wire of the plurality of N input wires for the bits of the N-bit encoded output value.

7. The device of claim 1,
    wherein at least one output wire of the plurality of N output wires is hardwired to a logically true value to output a positive numerical offset for the N-bit encoded output value when a numerical value of the N-bit encoded input value is zero, or
    wherein at least one output wire of the plurality of N output wires is hardwired to a logically false value such that a respective output bit for the N-bit encoded output value is set to zero regardless of a numerical value of the N-bit encoded input value.

8. The device of claim 1,
    wherein the N-bit encoded input value is a first N-bit encoded input value,
    wherein the plurality of N input wires is a first plurality of N wires configured to receive respective bits of the first N-bit encoded input value,
    wherein the device further comprises a second plurality of input wires configured to receive respective bits of a second encoded input value, and
    wherein the scaling network is further configured to apply the function to the second encoded input value by electrically routing at least one input wire of the second plurality of input wires to at least one output wire of the plurality of N output wires.

9. The device of claim 8,
    wherein a bit of the N-bit encoded output value is triggered to a logically true value by a first bit of the first N-bit encoded input value having a logically true value and a first bit of the second encoded input value having a logically true value, and
    wherein the bit of the N-bit encoded output value is alternated to a logically false value by a second bit of the first N-bit encoded input value having a logically true value and a second bit of the second encoded input value having a logically true value.

10. The device of claim 1,
    wherein the input binary-encoded number is a first portion of a second input binary-encoded number,
    wherein the thermometer encoder is configured to convert the first portion of the second input binary-encoded number to the N-bit encoded input value, and
    wherein the device further comprises:
        first logic circuitry comprising the plurality of N input wires, the plurality of N output wires, and the scaling network circuitry, wherein the first logic circuitry is configured to produce a first output unary bit stream having the N-bit encoded output value;
second logic circuitry configured to perform operations on the N-bit encoded input value in parallel to produce a second output unary bit stream;
a first multiplexer configured to select the first output unary number or the second output unary number based on a second portion of the second input binary-encoded number; and
decoder configured to convert the selected output unary bit stream to an output binary number.

11. The device of claim 10, further comprising:
a second multiplexer configured to select an offset value based on the second portion of the second input binary-encoded number; and
an adder configured to add the selected output binary number to the selected offset value.

12. A method of performing a digital computational operation, the method comprising:
storing, in a register, an input binary-encoded number including fewer than N bits;
converting, by a thermometer encoder, the input binary-encoded number to an N-bit encoded input value, wherein the N-bit encoded input value includes a thermometer unary encoded input value or an edge encoded input value;
receiving, at digital computing circuitry through a plurality of N input wires, the N-bit encoded input value;
applying, by a scaling network circuitry of the digital computing circuitry, a function to the N-bit encoded input value to produce the N-bit encoded output value that is different from the N-bit encoded input value by simultaneously electrically routing at least one input wire of the plurality of N input wires to at least two output wires of the plurality of N output wires; and
outputting, by a plurality of N output wires, an N-bit encoded output value having the same number of bits as the N-bit encoded input value, wherein the N-bit encoded output value includes a thermometer unary encoded output value or an edge encoded output value.

13. The method of claim 12, further comprising:
receiving, by voting circuitry of the digital computing circuitry, the at least two input wires electrically routed by the scaling network for a single corresponding one of the output bits of the N-bit encoded output value; and
outputting, by a logic gate of the voting circuitry, the one of the output bits of the N-bit encoded output value based on the bits of the N-bit encoded input value carried by the at least two input wires electrically routed by the scaling network circuitry to the voting circuitry.

14. The method of claim 13, wherein applying the function by the scaling network circuitry comprises:
applying a monotonically increasing or monotonically decreasing function, an oscillating function having at least one minimum, or a function having at least one portion with a negative slope;
receiving, at the logic gate, the at least two input wires electrically routed by the scaling network to the single output wires; and
outputting, from the logic gate, a logically true value for the respective output bit of the N-bit encoded output value only when an odd number of input wires of the at least two input wires carries a logically true value, wherein the logic gate comprises an XOR gate.

15. The method of claim 12, further comprising:
wherein the input binary-encoded number is a first portion of a second input binary-encoded number,
wherein converting the input binary-encoded number to the N-bit encoded input value comprises converting the first portion of the second input binary number to the N-bit encoded input value, and
wherein the method further comprises:
producing, by the plurality of N output wires, a first output unary bit stream having the N-bit encoded output value;
producing a second output unary bit stream by performing operations on the N-bit encoded input value in parallel with producing the first output unary bit stream;
selecting the first output unary number or the second output unary number based on a second portion of the second input binary-encoded number; and
converting the selected output unary bit stream to an output binary number.

16. A device comprising:
a register configured to store a set of input binary bits, wherein the set of input binary bits encodes a first numerical value based on a base-two representation;
input circuitry configured to convert a first subset of the set of binary bits to produce an input unary bit stream, wherein the input unary bit stream encodes a numerical value based on a proportion of high bits in the input unary bit stream to a total number of bits in the input unary bit stream;
unary processing circuitry configured to perform operations on the input unary bit stream to produce a first set of output binary bits;
binary processing circuitry configured to perform operations on a second subset of the set of binary bits to produce a second set of output binary bits, wherein the second set of output binary bits encodes a second numerical value based on the base-two representation; and
output circuitry configured to produce a result based on the first set of output binary bits and the second set of output binary bits.

17. The device of claim 16, wherein the unary processing circuitry comprises:
first logic circuitry configured to perform operations on the input unary bit stream to produce a first output unary bit stream;
second logic circuitry configured to perform operations on the input unary bit stream to produce a second output unary bit stream; and
a first multiplexer configured to produce the first set of output binary bits by selecting the first output unary number or the second output unary number based on the second subset of binary bits,
wherein there is overlap between the first subset of the set of binary bits and the second subset of the set of binary bits.

18. The device of claim 16, wherein the unary processing circuitry comprises:
a plurality of input wires, wherein each input wire of the plurality of input wires is configured to receive a respective input bit of the input unary bit stream;
a plurality of output wires, each output wire of the plurality of output wires configured to output a respective output bit of an output unary bit stream; and
scaling network circuitry configured to apply a function to the input unary bit stream by simultaneously electrically routing at least one input wire of the plurality of input wires to at least two output wires of the plurality of output wires.

19. The device of claim 1, wherein the scaling network circuitry is configured to apply the function to the N-bit encoded input value by applying a hyperbolic function or an exponential function to the N-bit encoded input value.

20. A device comprising:
an encoder configured to convert a first portion of an input binary number to an N-bit encoded input value, wherein the N-bit encoded input value includes a thermometer unary encoded input value or an edge encoded input value;
first logic circuitry comprising:
a plurality of N input wires and a plurality of N output wires, each input wire of the plurality of N input wires configured to receive a respective input bit of the N-bit encoded input value, and each output wire of the plurality of N output wires configured to output a respective output bit of an N-bit encoded output value having the same number of bits as the encoded input value, wherein the N-bit encoded output value includes a thermometer unary encoded output value or an edge encoded output value; and
scaling network circuitry configured to apply a function to the N-bit encoded input value to produce a first output unary bit stream having the N-bit encoded output value that is different from the N-bit encoded input value by simultaneously electrically routing at least one input wire of the plurality of N input wires to at least two output wires of the plurality of N output wires;
second logic circuitry configured to perform operations on the N-bit encoded input value in parallel to produce a second output unary bit stream;
a first multiplexer configured to select the first output unary number or the second output unary number based on a second portion of the input binary number; and
decoder configured to convert the selected output unary bit stream to an output binary number.

\* \* \* \* \*